United States Patent
Bonora et al.

(10) Patent No.: US 7,066,707 B1
(45) Date of Patent: Jun. 27, 2006

(54) WAFER ENGINE

(75) Inventors: Anthony C. Bonora, Woodside, CA (US); Richard H. Gould, Fremont, CA (US); Roger G. Hine, San Carlos, CA (US); Michael Krolak, Los Gatos, CA (US); Jerry A. Speasl, Pleasanton, CA (US)

(73) Assignee: Asyst Technologies, Inc., Fremont, CA (US)

( * ) Notice: Subject to any disclaimer, the term of this patent is extended or adjusted under 35 U.S.C. 154(b) by 0 days.

(21) Appl. No.: 10/087,400

(22) Filed: Mar. 1, 2002

Related U.S. Application Data

(60) Provisional application No. 60/316,722, filed on Aug. 31, 2001.

(51) Int. Cl.
*B65G 49/07* (2006.01)

(52) U.S. Cl. .............. 414/744.3; 414/749.4; 414/937; 901/17

(58) Field of Classification Search .......... 414/744.3, 414/749.4, 937; 901/17
See application file for complete search history.

(56) References Cited

U.S. PATENT DOCUMENTS

| | | | |
|---|---|---|---|
| 4,770,590 A * | 9/1988 | Hugues et al. | 414/172 |
| 5,306,380 A | 4/1994 | Hiroki | |
| 5,460,478 A | 10/1995 | Akimoto et al. | |
| 5,626,456 A * | 5/1997 | Nishi | 414/404 |
| 5,645,391 A | 7/1997 | Ohsawa et al. | |
| 5,794,487 A * | 8/1998 | Solomon et al. | 74/490.03 |
| 5,928,390 A * | 7/1999 | Yaegashi et al. | 29/25.01 |
| 6,002,840 A * | 12/1999 | Hofmeister | 700/245 |
| 6,013,920 A | 1/2000 | Gordon et al. | |
| 6,091,498 A | 7/2000 | Hanson et al. | |
| 6,099,643 A * | 8/2000 | Ohtani et al. | 118/52 |
| 6,138,721 A | 10/2000 | Bonora et al. | |
| 6,142,722 A | 11/2000 | Genov et al. | |
| 6,147,329 A * | 11/2000 | Okamura et al. | 219/390 |
| 6,155,768 A | 12/2000 | Bacchi et al. | |
| 6,188,323 B1 | 2/2001 | Rosenquist et al. | |
| 6,220,808 B1 | 4/2001 | Bonora et al. | |
| 6,261,044 B1 | 7/2001 | Fosnight et al. | |
| 6,281,516 B1 | 8/2001 | Bacchi et al. | |
| 6,327,517 B1 * | 12/2001 | Sundar | 700/245 |

FOREIGN PATENT DOCUMENTS

| | | |
|---|---|---|
| FR | 2 778 496 | 5/1998 |
| JP | WO 99/39386 | 8/1999 |
| JP | 2001031211 | 6/2001 |
| WO | WO 01/10756 A1 | 2/2001 |
| WO | WO 01/14227 | 3/2001 |

OTHER PUBLICATIONS

U.S. Appl. No. 10/087,638, Bonora et al.
U.S. Appl. No. 10/087,092, Bonora et al.
U.S. Appl. No. 09/729,463, filed Jun. 6, 2002, R. Hine et al.
U.S. Appl. No. 09/115,414, Rosenquist et al.
U.S. Appl. No. 10/194,702, filed Jul. 12, 2002, Roger Hine.

* cited by examiner

*Primary Examiner*—Thomas J. Brahan
(74) *Attorney, Agent, or Firm*—O'Melveny & Myers LLP

(57) ABSTRACT

An integrated system is disclosed for workpiece handling and/or inspection at the front end of a tool. The system comprises a rigid member of unitary construction such as a metal plate which mounts to the front of a tool associated with a semiconductor process. The front end components, including the load port assemblies, prealigners and workpiece handling robot, are mounted to the plate to provide precise and repeatable positioning of the front end components with respect to each other.

13 Claims, 35 Drawing Sheets

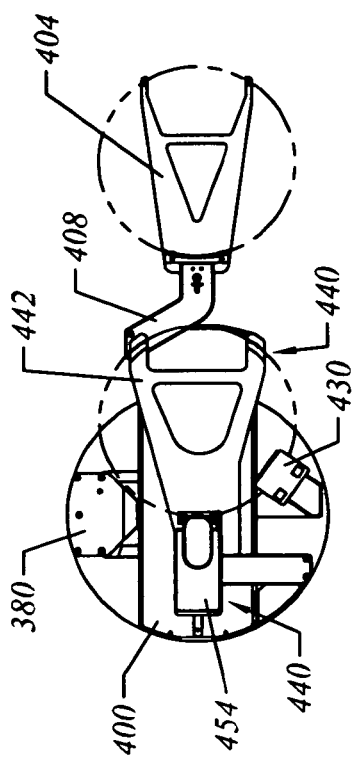
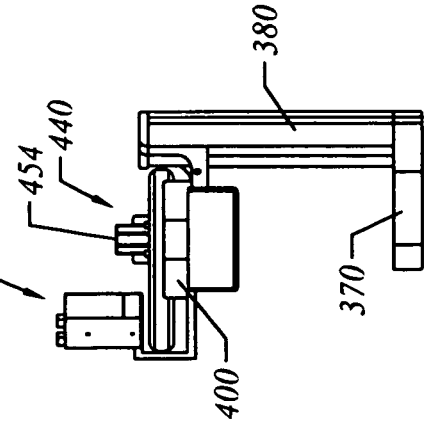
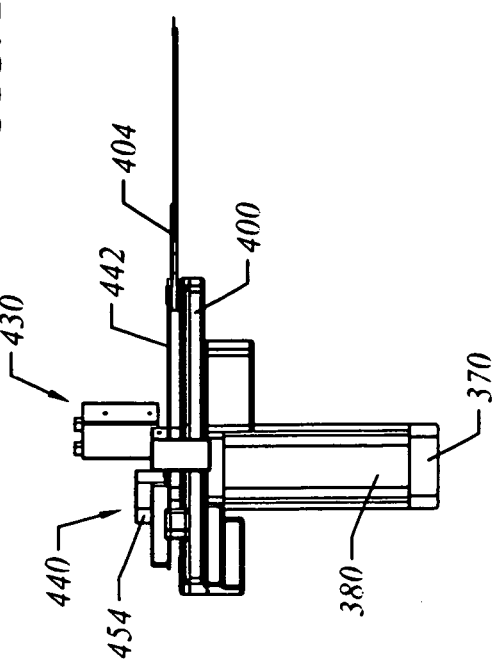
FIG. 22B
FIG. 22D
FIG. 22C

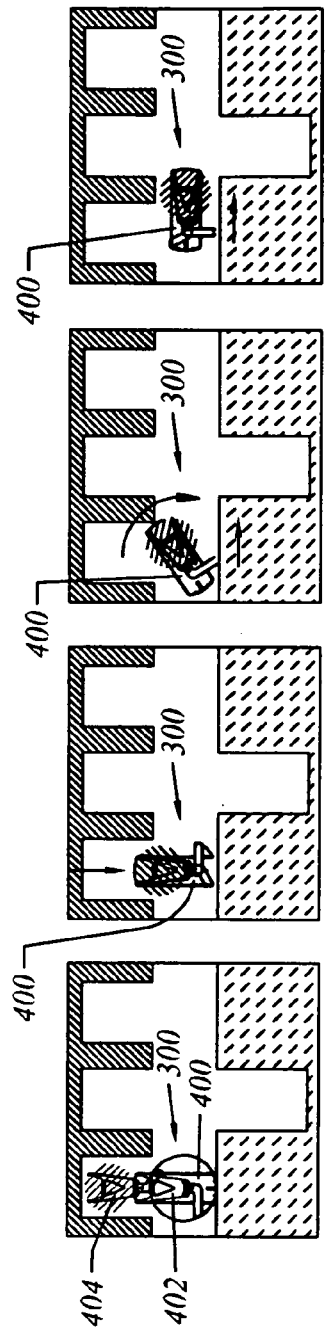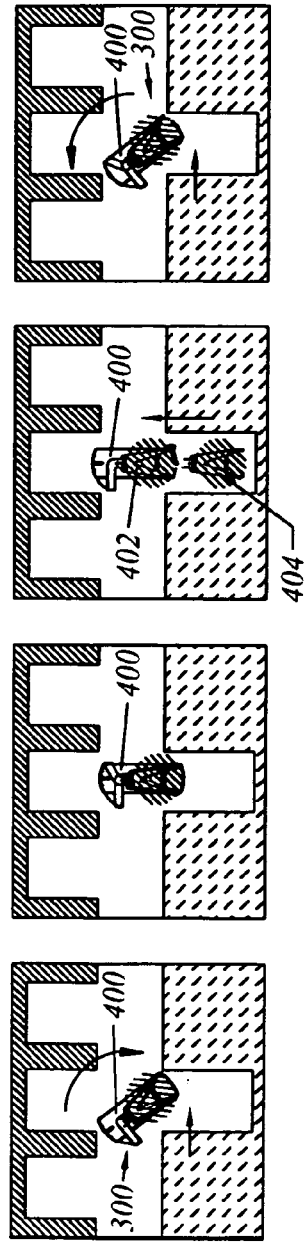

WAFER ENGINE

CLAIM OF PRIORITY

This application claims priority from provisional application entitled "UNIVERSAL MODULAR PROCESSING INTERFACE SYSTEM", application Ser. No. 60/316,722, filed Aug. 31, 2001, and which application is incorporated herein by reference.

CROSS-REFERENCE TO RELATED APPLICATIONS

U.S. patent application Ser. No. 10/087,638, filed Mar. 1, 2002, entitled "UNIFIED FRAME FOR SEMICONDUCTOR MATERIAL HANDLING SYSTEM"; AND U.S. patent application Ser. No. 10/087,092, filed Mar. 1, 2002, entitled "SEMICONDUCTOR MATERIAL HANDLING SYSTEM".

FIELD OF THE INVENTION

The present invention generally relates to a wafer transfer system. More particularly, the present invention is a unified, scalable frame or structure that equipment front end module (EFEM) components mount to, and wafer engine for transferring wafers.

BACKGROUND OF THE INVENTION

Standard Mechanical Interface Pods (SMIF) pods) are in general comprised of a pod door which mates with a pod shell to provide a sealed environment in which wafers may be stored and transferred. One type of pod is a front opening unified pod, referred to as FOUP 10, in which the pod door is located in a vertical plane, and the wafers are supported either in a cassette mounted within the pod shell, or two shells mounted in the pod shell.

During the fabrication of semiconductor wafers, the SMIF pods are used to transport the workpieces between various tools in the wafer fab. These tools include process tools for forming integrated circuit patterns on the wafers, metrology tools for testing the wafers, sorters for sorting and rearranging the wafers within one or more SMIF pods, and stockers for large scale storage of SMIF pods. The tools are generally laid out in a wafer fab in one of two configurations, a bay and a chase configuration or a ballroom configuration. In the former arrangement, only the front of the tool including the workpiece I/O port is maintained in the clean room environment of Class-1 or better. In the ballroom configuration, the tools are arranged in clusters according to the operations they perform, with the entire tool being maintained in the clean room environment of Class-1 or better.

Tools within a wafer fab include a front-end interface which houses components that facilitate and monitor the transfer of workpieces (i.e. wafers) between the pods to the tools. A conventional front end or equipment front end module (EFEM) 20 is shown in FIGS. 1–2. EFEMs 20 are generally constructed at a tool manufacturer and then shipped to a wafer fab.

An EFEM 20 generally includes a housing 22 which is fixed to the front of the tool and a workpiece handling robot 24 mounted within the housing and is capable of x, r, θ, Z motion to transfer workpieces between the workpiece carriers, tool and other front end components. The robot 24 is generally mounted with level screws that will allow the adjustment of the planarity of the robot 24 once the EFEM 20 is constructed and affixed to a tool.

In addition to a robot 24, the EFEM 20 generally includes one or more prealigners 26 for performing the operation of wafer center identification, notch orientation, and indocile mark reading. The prealigner(s) 26 are commonly bolted into the housing 22 with level screws allowing the planarity of the prealigner(s) to be adjusted once the EFEM 20 is constructed and affixed to a tool.

An EFEM 20 further includes one or more load port assemblies 28 for receiving a workpiece carrier, opening the carrier, and presenting the workpiece to the robot 24 for transfer of the workpieces between the carrier, and other processing tools. For 300 mm wafer processing, a vertically oriented frame, commonly referred to as a Box Opener-Loader Tool Standard Interface (or "BOLTS" interface), has been developed by Semiconductor Equipment and Materials International ("SEMI"). The BOLTS interface attaches to, or is formed as apart of, the front end of a tool, and provides standard mounting points for the load port assembly to attach to the tool. U.S. Pat. No. 6,138,721, entitled "Tilt and Go Load Port Interface Alignment System," which is assigned to the owner of the present application and which is incorporated by reference in its entirety herein, discloses a system for adjusting a load port assembly to the proper position adjacent a BOLTS interface and then affixing the load port assembly to the interface.

Once the robot 24, the prealigners 26 and load port assemblies 28 have been mounted to the housing 22, the EFEM 20 is shipped to the wafer fab and affixed to a tool within the fab. After being properly secured to the tool, the EFEM components are leveled within the housing 22 via the leveling screws, and the robot 24 is then taught the acquisition and drop-off positions it will need to access for workpiece transfer between the load port assemblies, the prealigners and the tool. A system for teaching the various acquisition and drop-off positions for the robot within the tool front end is disclosed in U.S. patent application Ser. No. 09/729,463, entitled "Self Teaching Robot," which application is assigned to the owner of the present application and which application is incorporated by reference herein in its entirety. Once the robot positions have been taught, side panels are attached to housing 22 to substantially seal the housing against the surrounding environment.

For example, conventional EFEMs include many separate and independent workpiece handling components mounted within an assembled housing. The housing 22 includes a structural frame, bolted, constructed or welded together, in a plurality of panels affixed to the frame. After the housing 22 is assembled, the EFEM components are fixed to the various panels. It is a disadvantage to prior art EFEMs that the overall system tolerances are compounded with each frame member, panel and component connection. The result is that the assembled EFEM components are poorly aligned and need to be adjusted to the proper position with respect to each other. The robot 24 must also be taught the relative positions of the components so that the EFEM components can interact with each other. This alignment and teaching process must take place every time there is an adjustment to one or more of the EFEM components.

A further shortcoming of the prior art is that EFEM components are frequently made by different suppliers, each with its own controller and communication protocols. Steps must be taken upon assembly of the EFEM so that the controllers of each component can communication with each other and the components can interact with each other. The separate controllers also complicate maintenance and add to the parts and electrical connections provided in the EFEM. Further still, especially in a ballroom configuration, the convention EFEM takes up a large amount of space within a Class-1 cleanroom environment where space is at a premium.

Today's 300 mm semiconductor EFEMs are comprised of several major subsystems including SEMI E15.1 compliant load modules (typically 2–4 per tool). For example, an EFEM may consist of a wafer handling robot and a fan filter unit mounted to a structural steel frame, and have panels to enclose the wafer handling area between the load ports and the process tool. The combination of these components provides a means of transferring wafers to and from a FOUP 10, and between the FOUP and the process tool wafer dock(s). FOUPs 10 are manually loaded via operators or automatically loaded via an automated material handling system (AMHS) delivered to and taken from the Load Port. Industry Standards have been created to allow multiple vendors to provide the Load Port, FOUP 10, or other EFEM components to be integrated as a system.

The Load Port component provides a standard interface between the AMHS and the wafer handling robot in the EFEM. It provides a standardized located to set the FOUP 10, docks the FOUP 10 to seal the front surface, and opens and closes the door to allow access to the wafers in the FOUP 10. The dimensions of this unit are all specified in SEMI E15.1

The Load Port attaches to the Front End via the Bolts Interface which is defined by SEMI E-63. This standard defines a surface and mounting holes to which the Load Port attaches. It is defined to start at the fab floor and goes as high as 1386 mm from the floor and is about 505 mm wide per Load Port. As a result, the load port completely blocks off the process tool from the operator aisle in the fab. SEMI E-63 also defines load port dimensions on the total side to ensure interchangeability with a variety of robot manufacturers.

The primary functions of the load port include accepting a FOUP 10 from and presenting to a FOUP 10 to the Fab AMHS, moving the FOUP 10 towards and away from the port seal surface (docking/undocking), and opening and closing the FOUP door. In addition, it must perform functions such as locking the FOUP 10 to the advance plate, and unlock the FOUP door, and a variaety of lot ID and communication functions. Per SEMI E15.1, all of these functions are contained in a single monolithic assembly which is typically added or removed from the tool front end as a complete unit.

The load port must be aligned with precision to the wafer robot. If there are multiple load ports in the system, they must all present the wafers in level parallel planes. Typically, the Load Ports provide several adjustments to planarize the wafer in the FOUP 10 with the robot. In order to minimize time spent calibrating the robot to each of the 25 wafer positions in each of the FOUPs 10, specialized tools and alignment fixtures are used in conjunction with all of the adjustments. If a load port is swapped out with a new one, the calibration procedure can be quite lengthy.

In addition to alignment the robot to the wafers positions, the door mechanism must also be aligned with the door opening and the door seal frame. Again, this is typically performed with alignment fixtures and tools either on the tool front end or off line.

The robot must also be leveled and aligned with one or more tool drop off point. This is typically done manually by teaching the robot the position and making planarity adjustments either on the front end or the tool.

It is the combination of all of these relationships between the tool, the robot, and the FOUPs 10 which make setting up a tool front end so time consuming. All of the components are typically attached to a relatively low precision frame, and adjustments are used to compensate for it. The load ports are mounted to the front surface, the robot to the base, the fan/flter unit (FFU) to the top, and skins on all other open surfaces to complete the mini-environment enclosure.

It would be advantageous to minimize the adjustments between the components and reduce the overall time required to align the load port. The present invention provides such an advantage.

SUMMARY OF THE INVENTION

One aspect of the present invention is to provide a unified structure or frame that precisely ties many critial EFEM components together. In one embodiment, the frame serves as a single reference for aligning the interior and exterior EFEM components. In another embodiment, the interior and exterior EFEM components are aligned in relation toe ach vertical strut of the frame.

Another aspect of the present invention is to provide a unified structure or frame that is scalable in size. In one embodiment, the unified structure includes vertical struts secured to an upper and lower support member. The number of vertical struts and the length of the upper and lower support member depends on the number of I/O ports within the EFEM. Similarly, the size and spacing of the vertical struts and the support members may vary to accommodate 200 mm wafers, 300 mm wafers, and 400 mm wafers.

Yet another aspect of the present invention is to accurately and precisely locate the front load components with respect to each other. Preferably, this calibration process is accomplished with a minimum number of adjustments. In one embodiment, all the interior and exterior EFEM components are precisely tied to the unified frame such that they share common reference points.

Yet another aspect of the present invention is to provide a unified frame that segregates and isolates the port door/carrier door assembly from the many of the interior EFEM components. In one embodiment, the port door/carrier door assembly is lowered into a separate air flow/storage area located within the mini-environment. The storage area prevents particles created by, for example, a wafer handling robot, from contaminating the assembly.

Still another aspect of the prevent invention is to provide a wafer carrier docking/interface plate than can be easily removed from the EFEM to access the interior of the EFEM. In one embodiment of the present invention, the removable plate is manufactured from a transparent material so that a user may observe any problems/malfunctions that occur within the mini-environment.

Still another aspect of the present invention is to decrease the footprint of the EFEM. In one embodiment, the EFEM is supported by a rolling stand whereby the bottom surface of the EFEM is raised off the floor of the wafer fab. The area between the wafer fab floor and the EFEM may serve as a maintenance access port to the processing tool, or an area to place auxiliary compartments.

Still another aspect of the present invention is to provide a wafer engine for transferring wafers. In one embodiment, the wafer engine may perform a number of inspection, marking, and metrology functions, eliminating the need for a separate processing station.

Still another aspect of the present invention is to provide a wafer engine that may transfer wafers within the reduced footprint of the EFEM. In one embodiment, a wafer engine includes a linear drive for moving the wafer along a x-axis, a vertical drive for moving the wafer z-axis, a radial drive for moving the wafer along a radial axis, and a rotational drive for rotating the vertical and radial drive about a theta axis.

A further aspect of the present invention is to provide loal filtering for various particle general mechanisms on the wafer engine. In one embodiment, a fan/filter unit is mounted to the radial drive to capture particles created by the radial drive. In another embodiment, an exhaust system creates an air flow through the vertical drive to capture any particles created by the vertical drive. These localized fan/filter units attempt to control particles created by the wafer engine by exhausting the particles into a "dirty-air" environment, or by first filtering the air before it is exhabusted back to a "clean air" environment.

Still another aspect of the present invention is to provide a wafer engine that has dual swap and align-on-the-fly capabilities. In one embodiment, the wafer engine has a rapid swap radical drive, or buffer capability, to simultaneously store and transfer two wafers. In another embodiment, an upper end effector may rotate and align a first wafer while a second wafer is stored and/or transported by a lower end effector.

Still another aspect of the present invention is to provide a wafer engine that has a removable/interchangeable slide body mechanism. In one embodiment, the slide body mechanism includes integrated processing tools such as an OCR reader, an aligner, an ID reader, or a metroloty tool. A removable slide body mechanism allows a wafer fab to incorporate the same wafer engine throughout whereby only the slide body mechanism must be customized to each individual process station.

Yet another aspect of the present invention is to provide a wafer engine having a vertical drive located above the theta drive. Such a vertical drive is located substantially within the FOUP 10 area and mimizes the footprint of the wafer engine.

The present invention provides all of these advantages.

DETAILED DRAWINGS OF THE PRESENT INVENTION

Figure 17A:
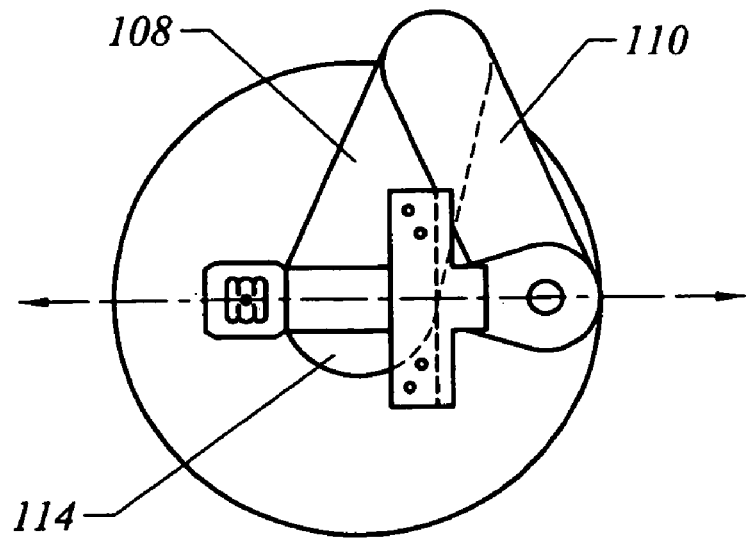
Figure 17B:
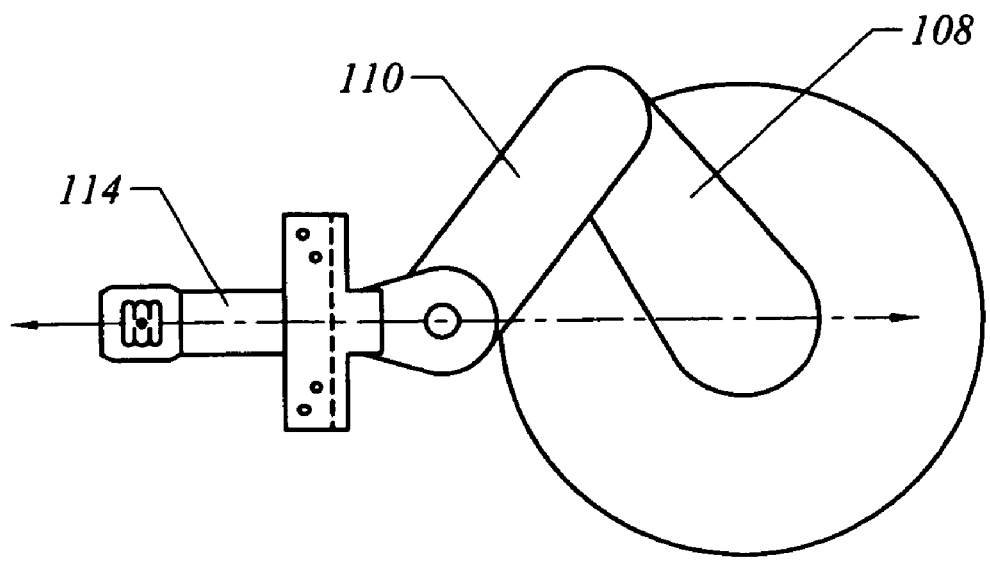
Figure 18:
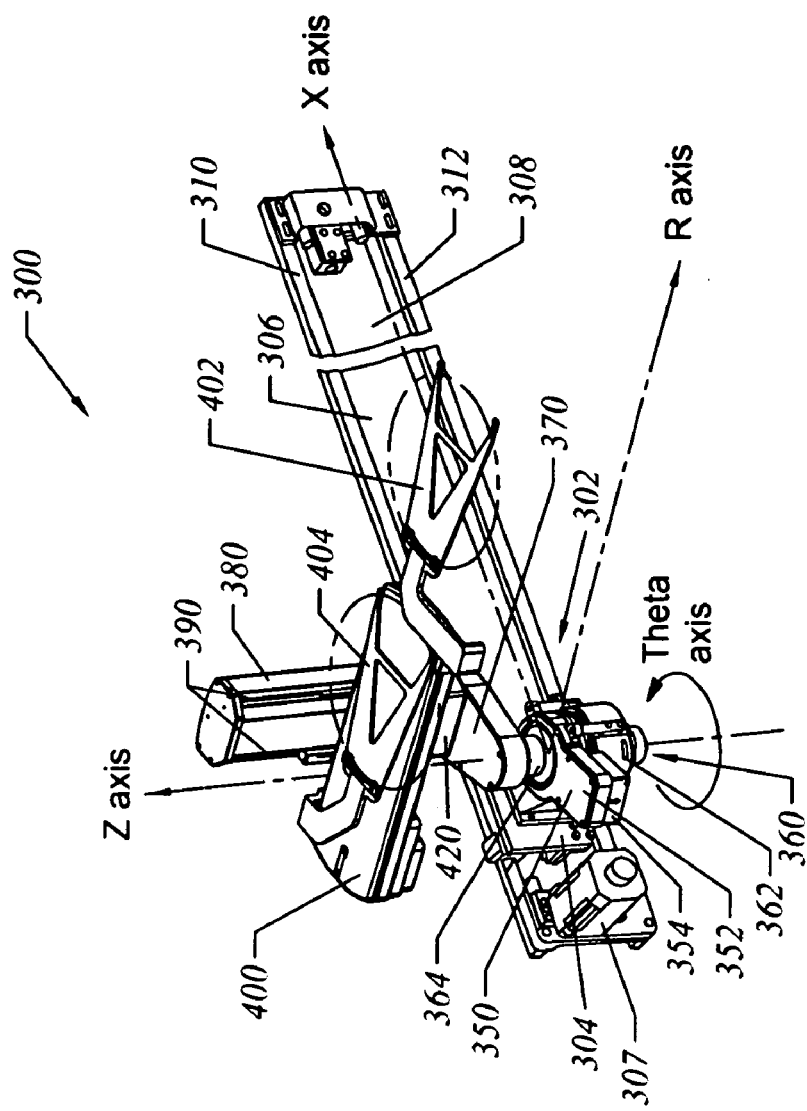
Figure 19:
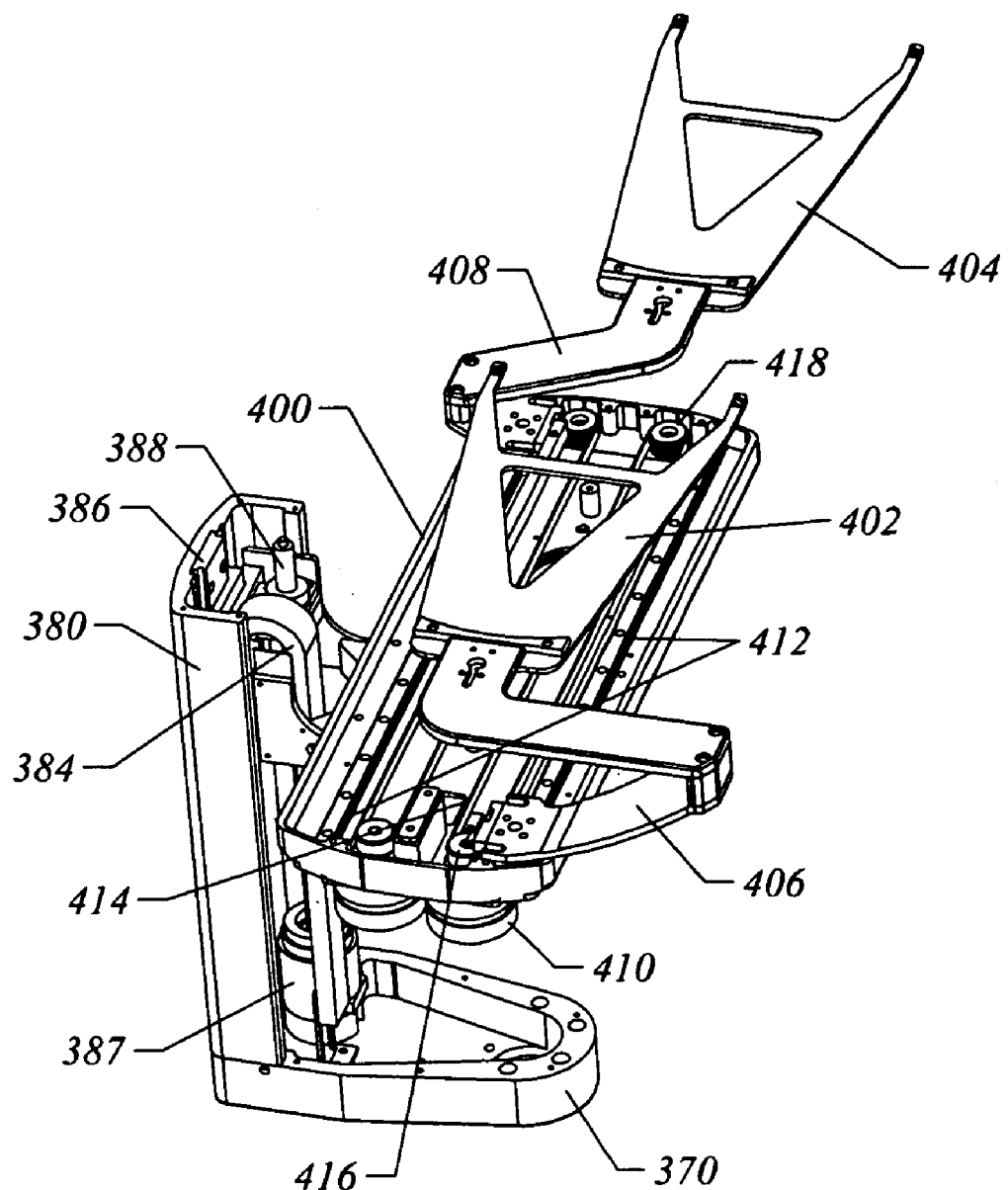
Figure 20:
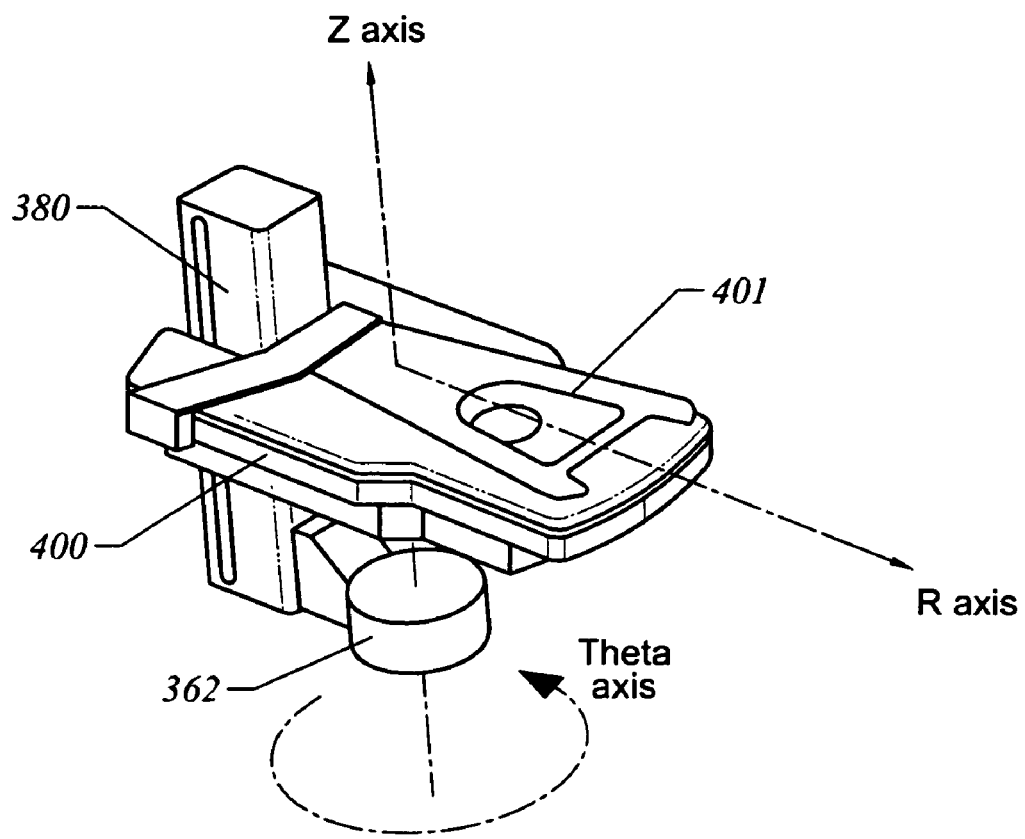
Figure 21:
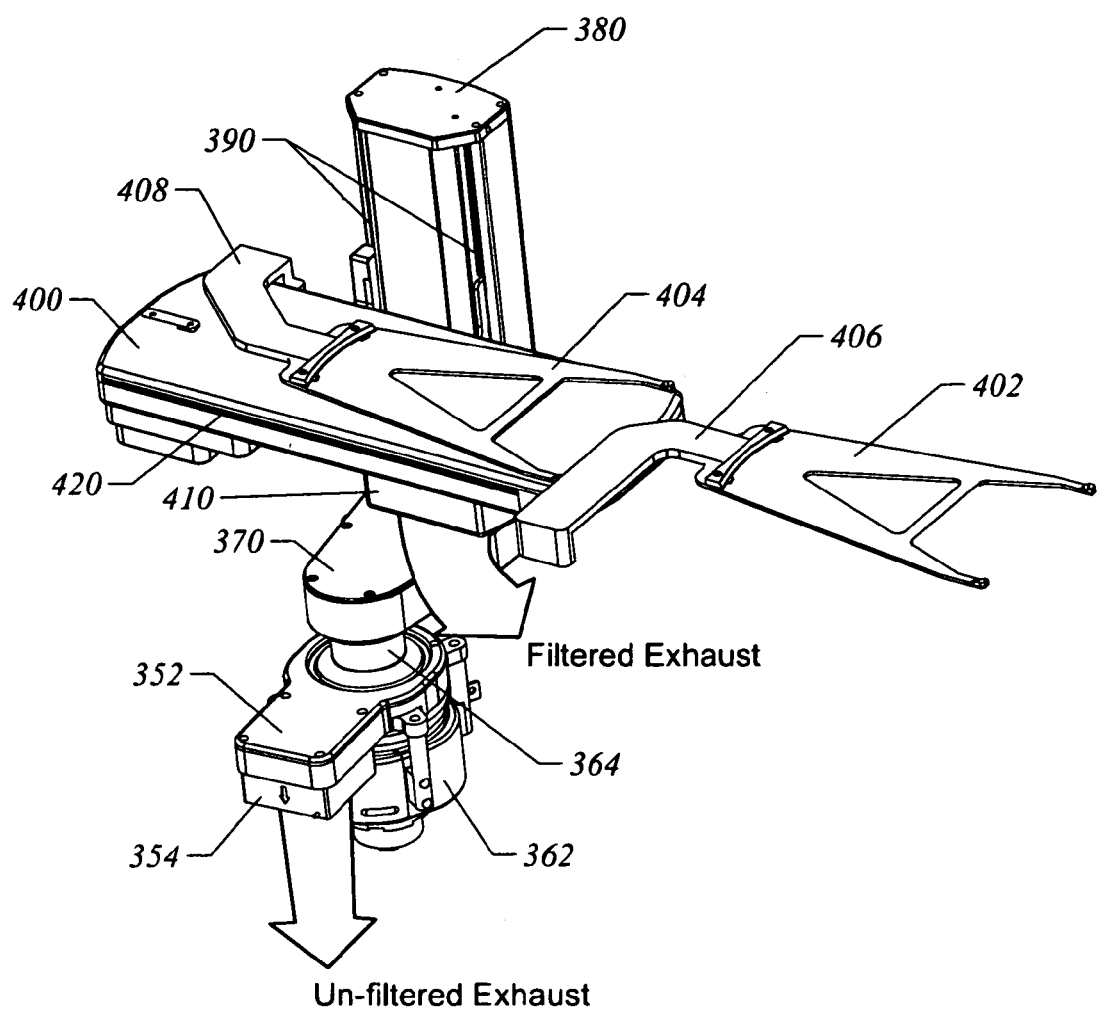
Figure 22A:
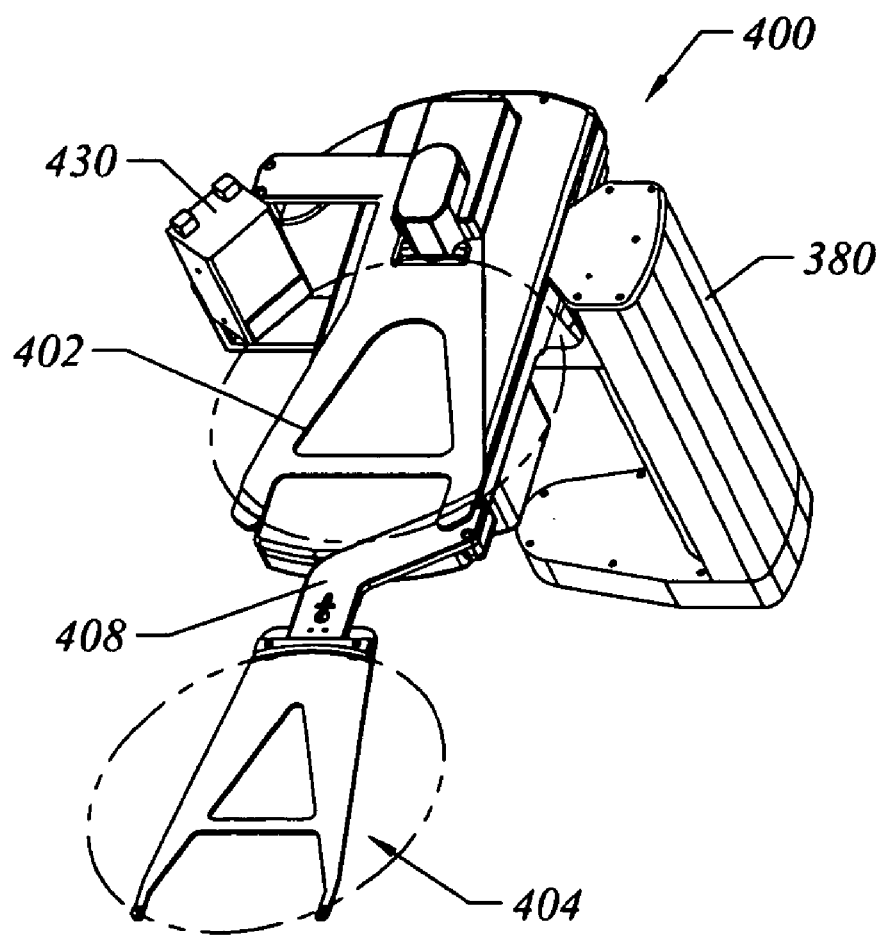
Figure 23:
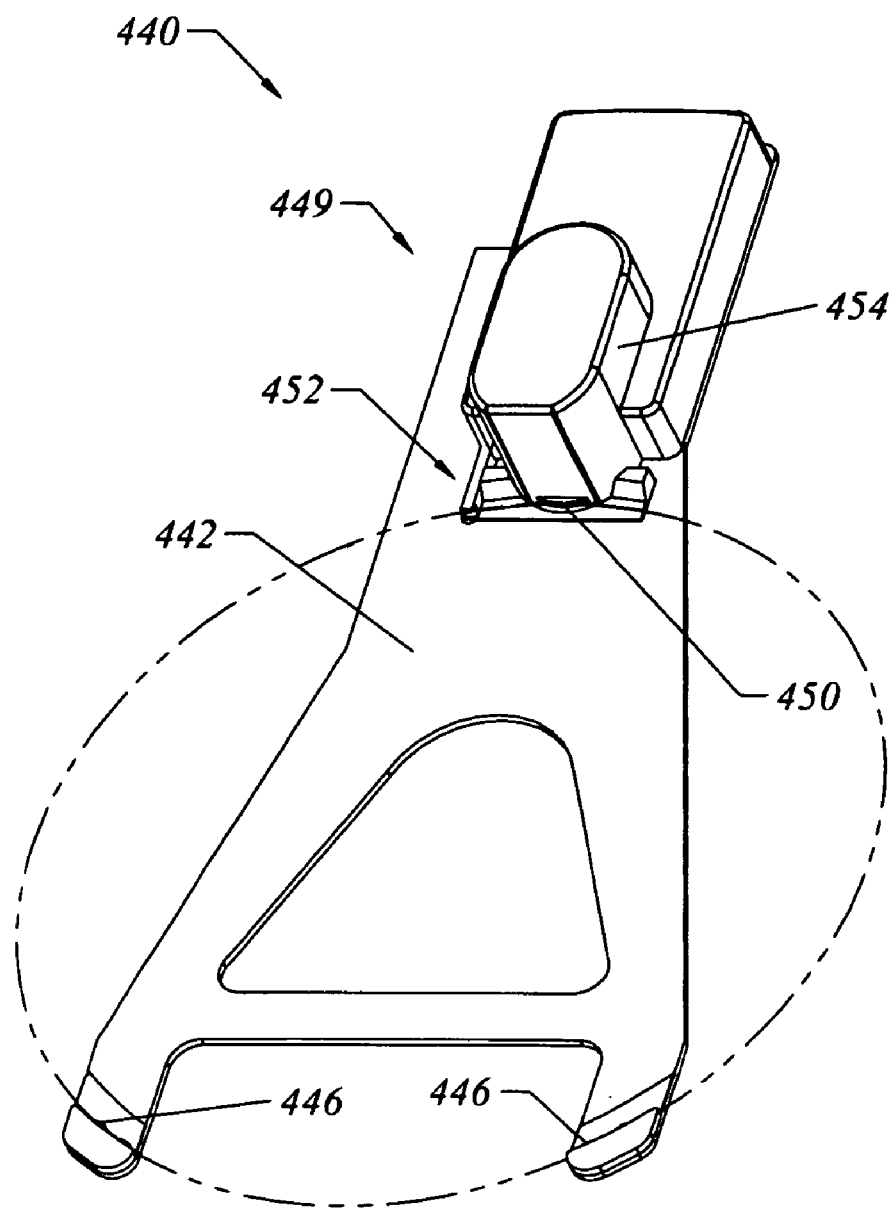
Figure 24A:
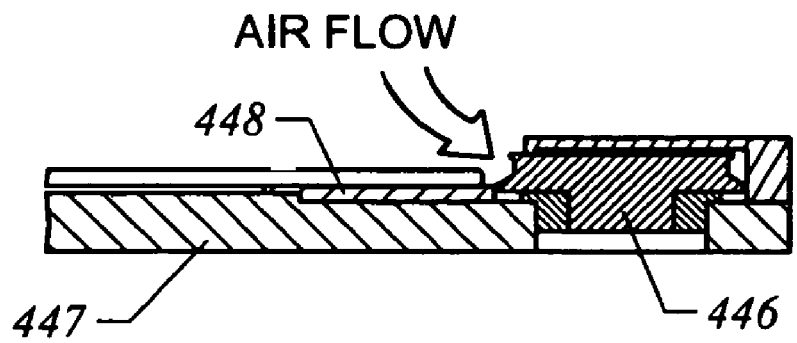
Figure 24B:
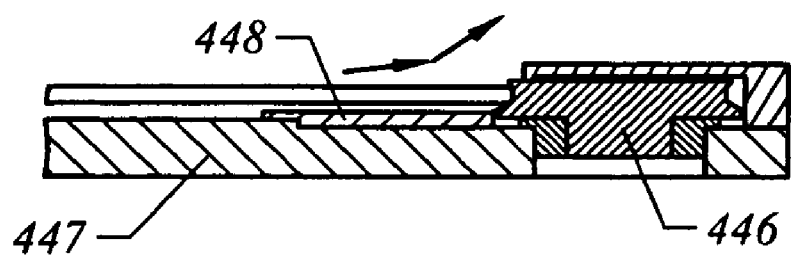
Figure 24C:
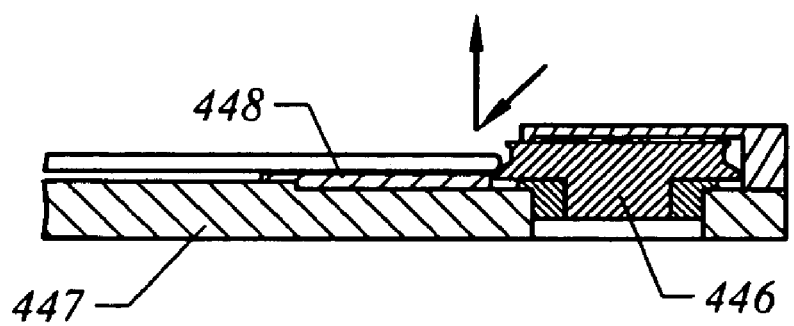
Figure 25:
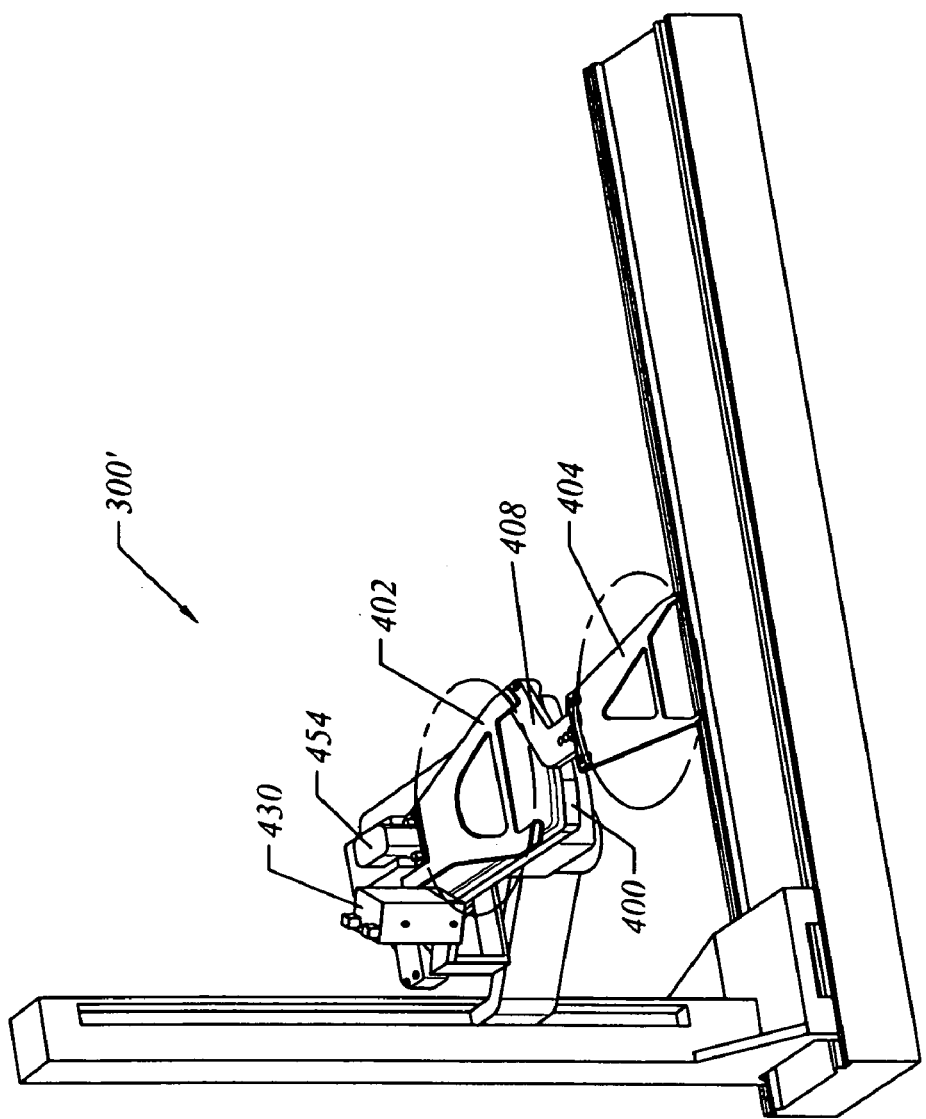
Figure 26B:
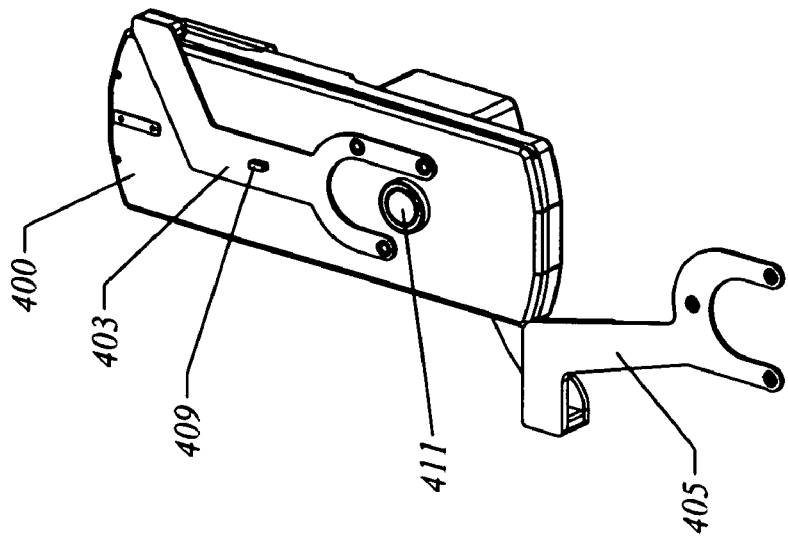
Figure 26A:
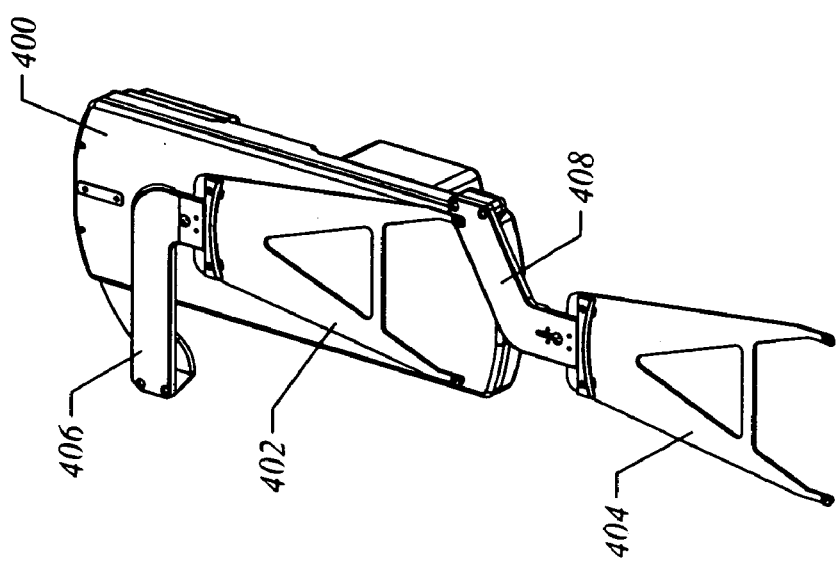
Figure 27A:
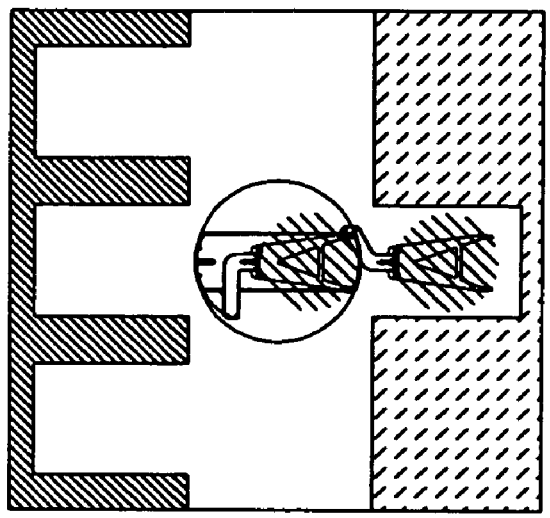
Figure 27B:
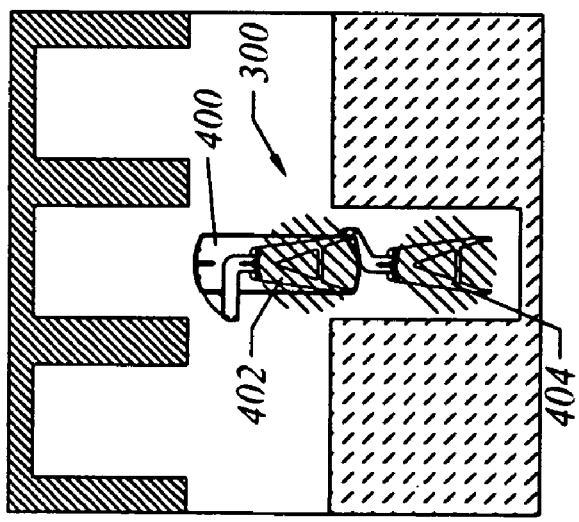
Figure 29A:
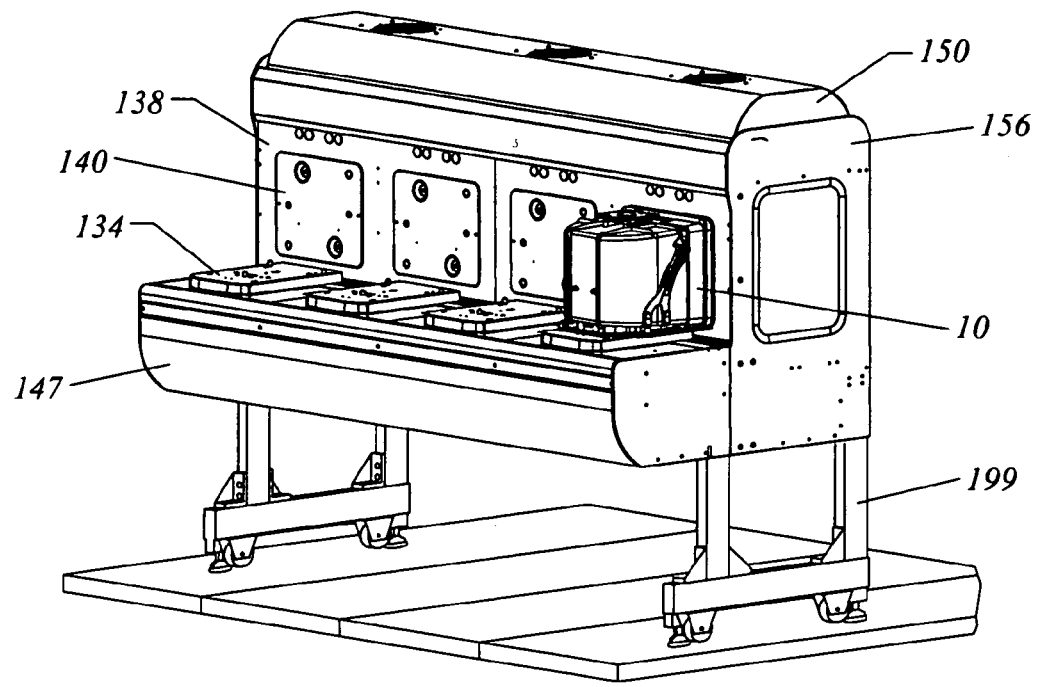
Figure 29D:
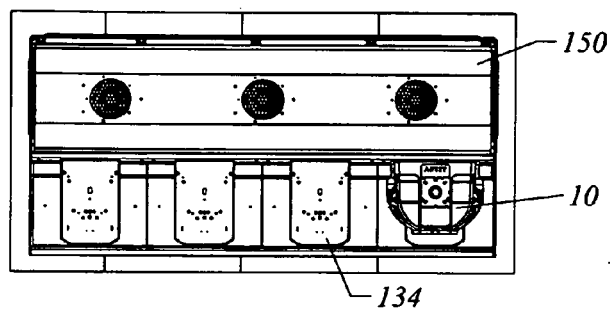
Figure 29B:
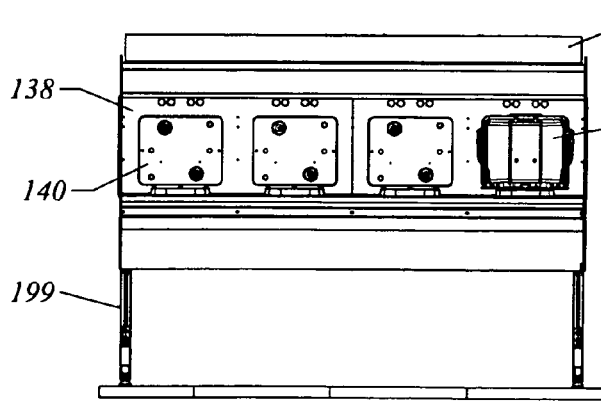
Figure 29C:
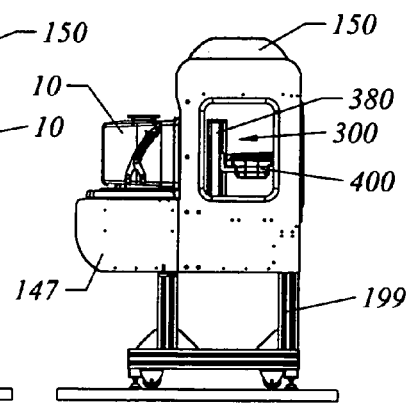
Figure 30A:
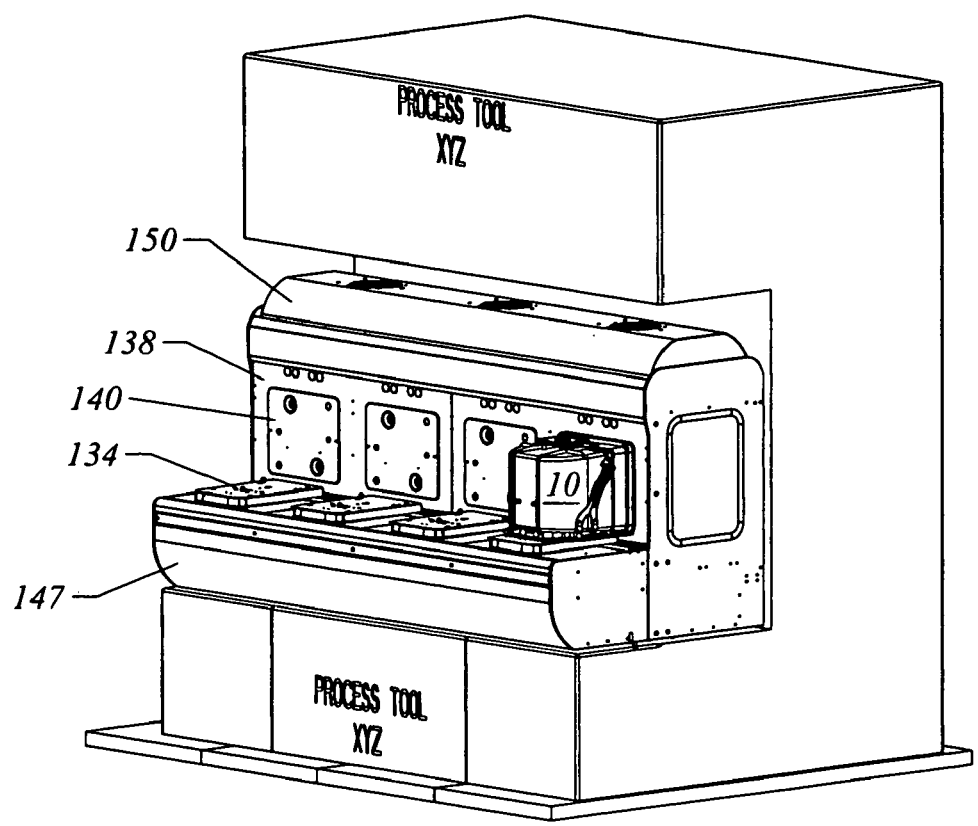
Figure 30B:
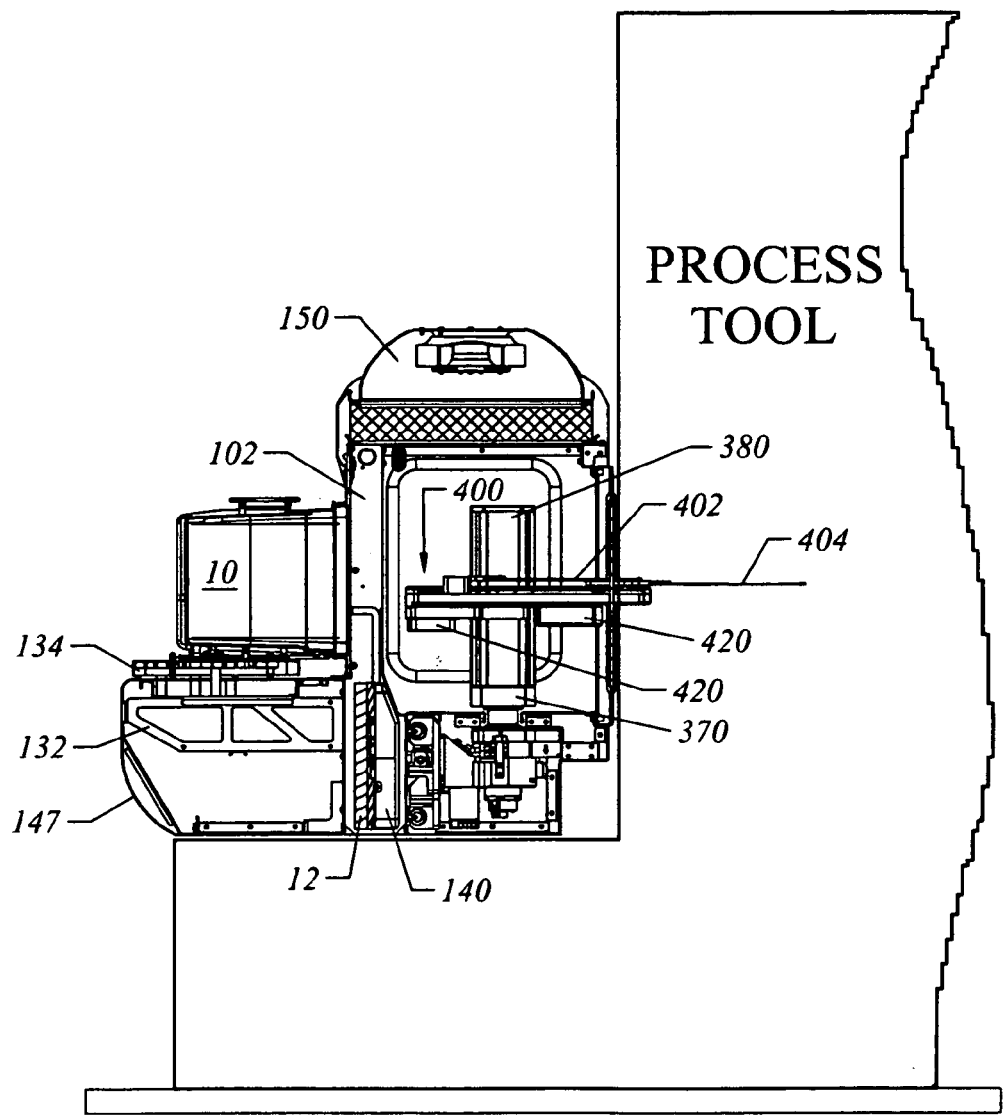

FIGS. 17A–17B; FIG. 17A is a top view of an embodiment of a conventional wafer handling robot; FIG. 17B is a top view of the wafer handling robot shown in FIG. 17A with the end effector extended, according to the prior art;

FIG. 18 is a perspective view of an embodiment of a rapid swap wafer engine, according to the present invention;

FIG. 19 is a perspective view of the wafer engine shown in FIG. 18 illustrating several of the components of the drive mechanisms and the vertical column and the slide body mechanism;

FIG. 20 is a perspective view of another embodiment of a wafer engine, according to the present invention;

FIG. 21 is a perspective view of the wafer engine shown in FIG. 18, illustrating the air flows created by the fan/filter units;

FIGS. 22A–22D; FIG. 22A is a perspective view of still another embodiment of a wafer engine equipped with a wheeled aligner and an ID reader on the slide body mechanism, according to the present invention; FIG. 22B is a top view of the wafer engine shown in FIG. 22A; FIG. 22C is a slide view of the wafer engine shown in FIG. 22A; FIG. 22D is a rear view of the wafer engine shown in FIG. 22A;

FIG. 23 is a perspective view of an embodiment of the upper end effector shown in FIG. 22A;

FIGS. 24A–24C; FIG. 24A is a cut away view of an embodiment of the wheeled end effector aligner illustrating a wafer supported by the pad; FIG. 24B is a cut away view of the wheeled end effector aligner in FIG. 24A illustrating the wafer lifted off the pad and supported by the wheel; FIG. 24C is cut away view of the wheeled end effector aligner shown in FIG. 24A illustrating the wafer being released by the wheel and set back down on the pad;

FIG. 25 is a perspective view of yet another embodiment of the wafer engine, according to the present invention;

FIGS. 26A–26B; FIG. 26A is a perspective view of another embodiment of the radical drive; FIG. 26B is still another embodiment of the radical drive;

FIGS. 27A–27B; FIG. 27A is a plan view illustrating the reach and swing clearance advantage of the wafer engine according to the present invention; FIG. 27B is a plan view of a conventional linear slide robot illustrating the minimum clearance and maximum reach required;

FIG. 28 illustrates an example motion sequence for the rapid swap slide body with off center rotation axis, according to the present invention;

FIGS. 29A–29D; FIG. 29A is a perspective view of an embodiment of the front end load interface, according to the present invention; FIG. 29B is a front view of the integrated system shown in FIG. 29A; FIG. 29C is a side view of an embodiment of the front end load interface shown in FIG. 29A; FIG. 29D is a plan view of an embodiment of the front end load interface shown in FIG. 29A;

FIGS. 30A–30B; FIG. 30A is a perspective view of an embodiment of the integrated system mounted to a processing tool;

FIG. 30B is a side view of the integrated system shown in FIG. 30A; and

Figure 31:
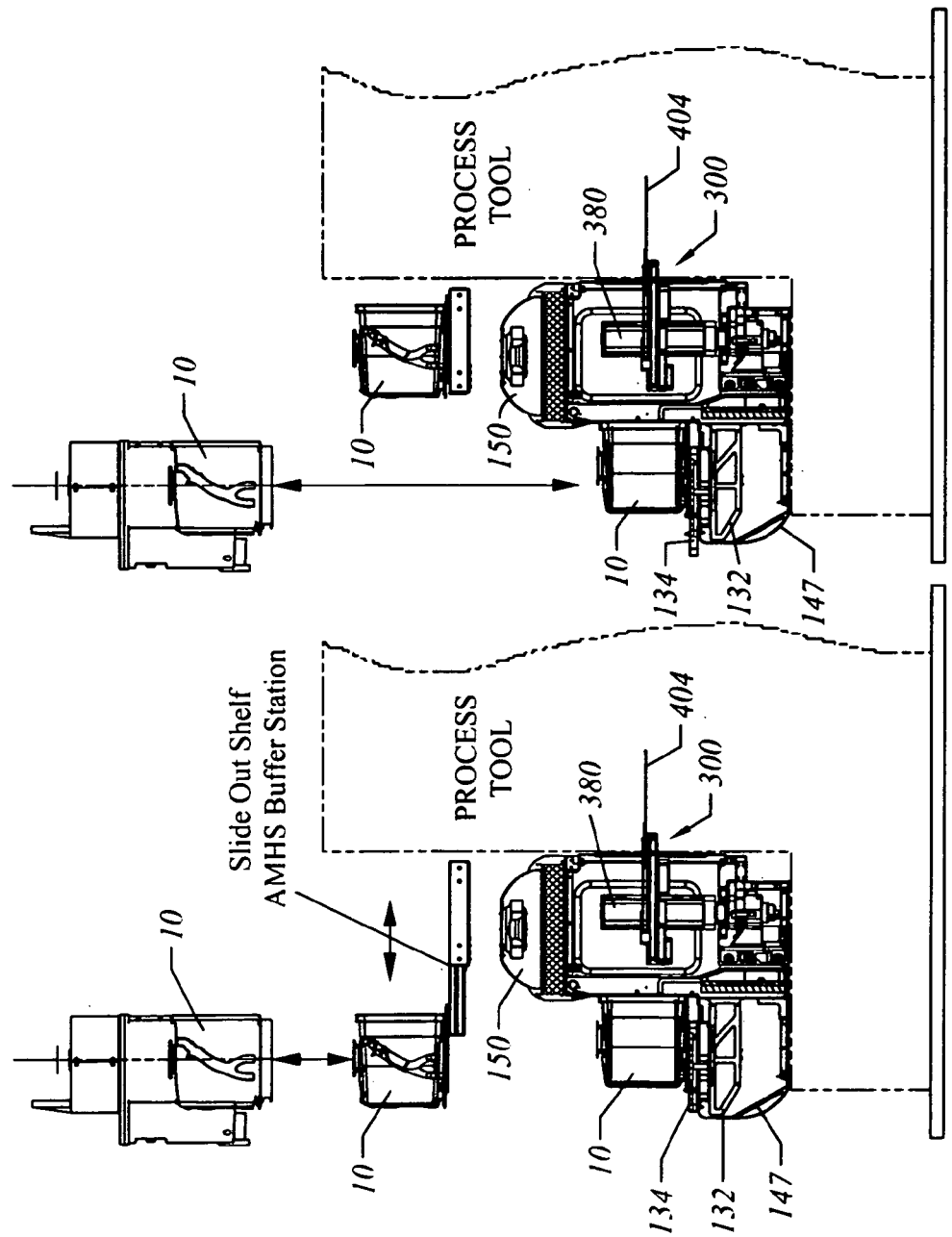

FIG. 31 is a side view of the integrated system shown in FIGS. 30A–30B, illustrating how the integrated system frees up space for Automated Material Handling System (AMHS) buffering.

Figure 32:
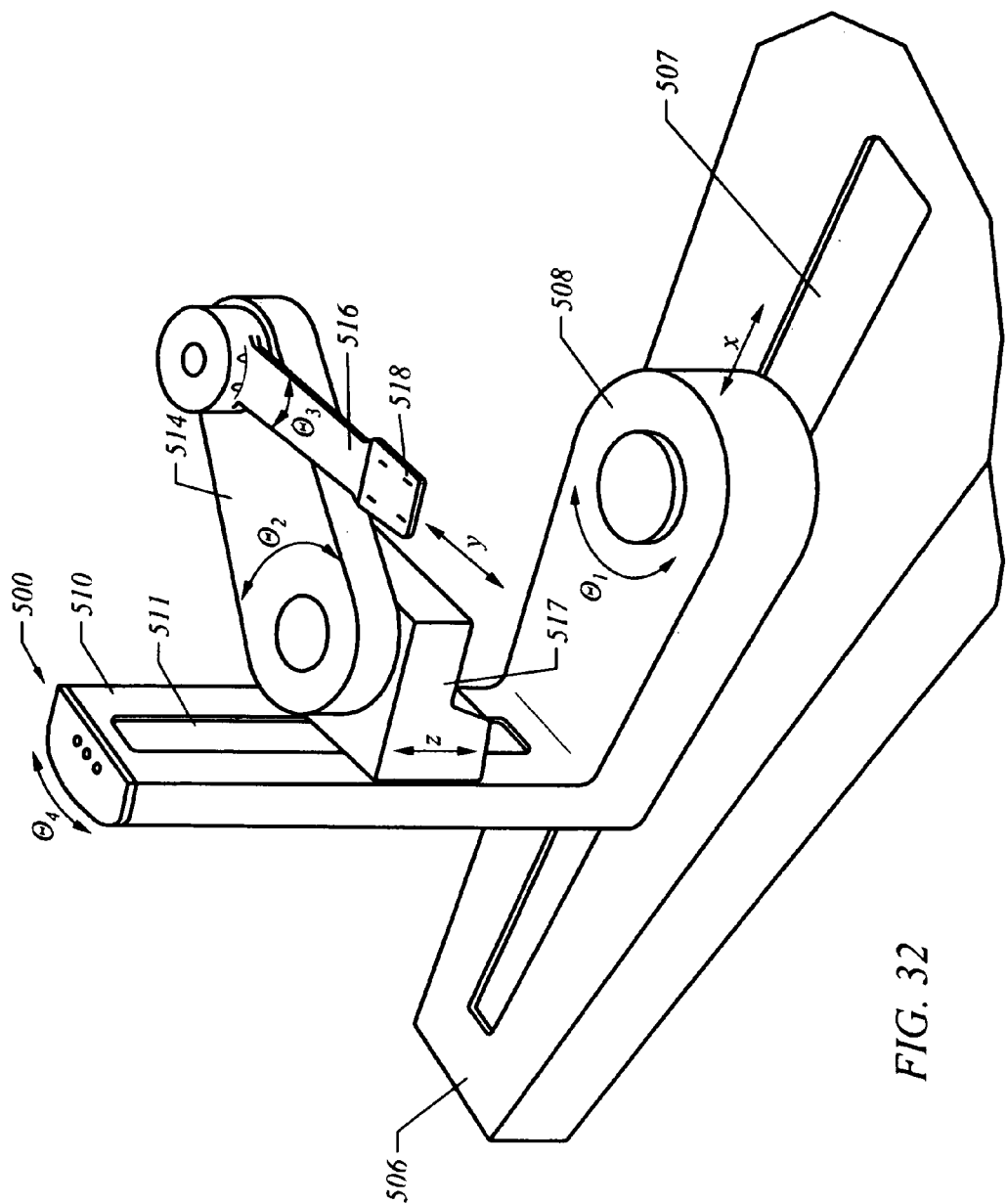

FIG. 32 is a perspective view of yet another embodiment of the wafer engine.

DETAILED DESCRIPTION OF THE PRESENT INVENTION

The present invention will now be described with reference to FIGS. 4–31, which relate generally to a wafer transfer system. The preferred embodiments of the present invention are used for 300 mm semiconductor wafer fabrication. The present invention may also be used in the fabrication of workpieces other than semiconductor wafers, such as for example reticles, flat paneled displays and magnetic storage disks. The present invention may also be used in the fabrication of workpieces larger or smaller than 300 mm, such as for example 200 mm and 150 mm. Moreover, while the present invention preferably operates within a FOUP system, it is understood that the present invention may operate with other workpiece transport systems, including open wafer cassette systems.

Unified Spine Structre

The spine structure 100 is based off the idea that a single unified frame or structure may serve as a base foundation for an EFEM. This foundation may be repeatedly manufactured in a similar fashion so as to lower the cost of the system, and allow EFEM components to mount to the frame to simplify alignment. The structure or frame 100 minimizes the amount of space required by a front end load tool. A frame or structure also minimizes alignment time and greatly simplifies access to components located inside the front end tool for maintenance procedures and/or services that are required.

Figure 4:
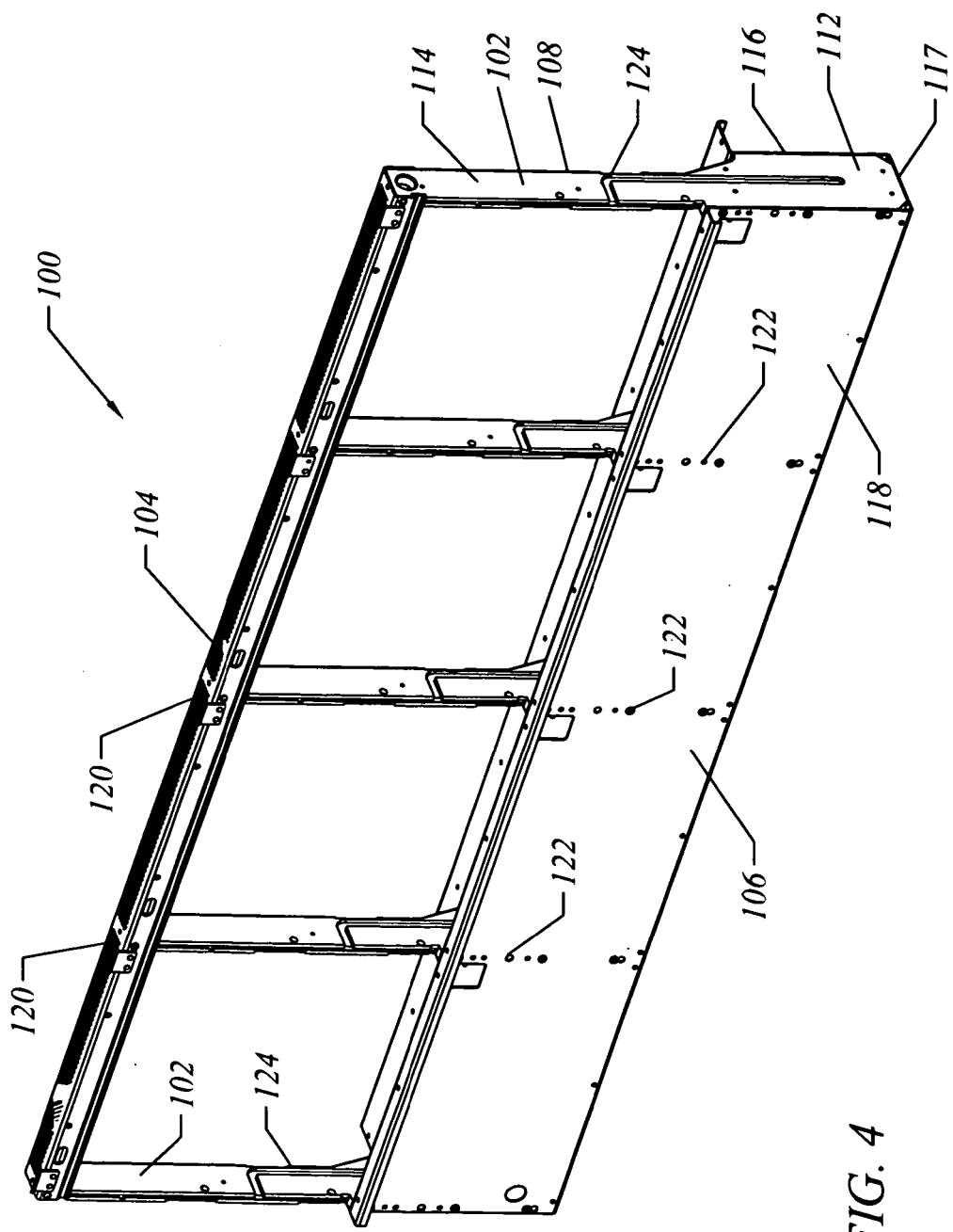
FIG. 4 is a perspective view of an embodiment of the spine structure, according to the present invention.
Figure 5:
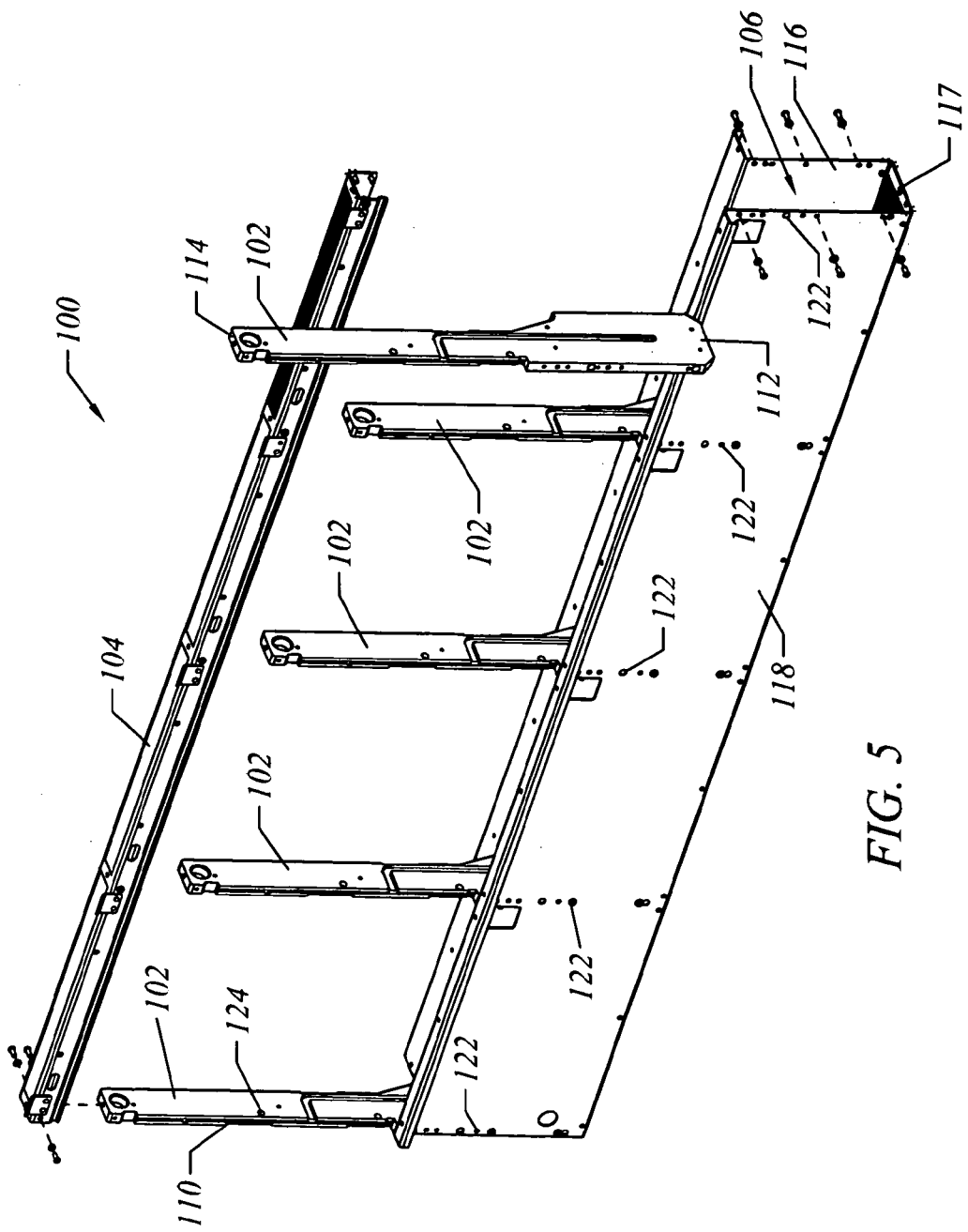
FIG. 5 is a partial exploded view of the spine structure shown in FIG. 4.

FIGS. 4–5 illustrate a preferred embodiment of the unified spine structure 100. The spine 100 includes multiple vertical struts 102 that are connected together by an upper channel or support member 104 and a lower channel or support member 106. Each vertical strut 102 has an inward face 108 and an outward face 110. As shown throughout FIGS. 4–10, each vertical strut 102 preferably has a substantially rectangular cross-section. A rectangular cross section is preferred so that the outward face 110 of each vertical strut 102 forms a seal with any EFEM component mounted to the vertical strut 102. The rectangular cross-section of each vertical strut 102 also ensures that the upper support member 104 and lower support member 106 are flush against the inward face 108 and outward face 110 when secured to each vertical strut 102. It is within the scope and spirit of the invention for the vertical strut 102 to have a different cross section such as, but not limited to, circular or oval.

In the preferred embodiment, the spine structure 100 is comprised primarily of sheet metal components, with a few machine components where the precision is required. The sheet metal is implemented in ways which take advantage of the precision that can be derived form some aspects of this fabrication technique. For example, the long bends in the upper support member 104 and lower support member 106 that form a "U"-shape provide a very straight reference to align the vertical struts 102. In a preferred embodiment, holes 120 and 122 are punched in the upper and lower channel 104 and 106 to further guarantee good hole to hole alignment between each vertical strut 102 and the upper and lower channel 104 and 106.

The sheet metal components also serve the function of exterior skins or mounting surfaces (described hereinafter) to the system as well as structural support. In current EFEM systems, sheet metal is usually reserved for non-structural panels which only provide cosmetic finish and containment. By incorporating sheet metal into several of the structural components, the material cost of the EFEM may be dramatically reduced.

The upper support member 104 is secured to the top portion 114 of each vertical strut 102, while the lower support member 106 is secured to the bottom portion 112 of each vertical strut 102. Accordingly, the spine 100 provides a very straight and stiff structure in both torsion and being to build a front end load system on. In a preferred embodiment, the upper support member 104 and the lower support member 106 are manufactured from a single piece of sheet metal. The bends in the sheet metal to create the upper support member 104 are dictated by the width of the upper portion 114 of each vertical strut 102, so that the width of the "U"-shaped upper support member 104 is substantially similar to the width of the upper portion 114 of each vertical strut 102. Similarly, the width of the lower "U"-shaped support member 106 is preferably substantially similar to the width of the bottom portion 112 of each vertical strut 102. Each support member 104 and 106 is intended to be flush against the inward face 108 and outward face 110 of each vertical strut 102.

In a preferred embodiment, the lower portion 112 of each vertical strut 102 is wider than the upper portion 114 of each vertical strut 102. As best shown in FIGS. 4–5, the spine structure 100 aligns each vertical strut 102 in a vertical orientation so that each vertical strut 102 is substantially parallel to each other. Each strut 102 is preferably spaced on 505 mm centers, which is the minimum allowed spacing for adjacing load ports per SEMI E-15.1. It is within the scope and spirit of the invention for the vertical struts 102 to be spaced apart at various or unequal distances.

To provide a rigid structure in both a torsional and lateral direction, each vertical strut 102 is secured to both the upper support member 104 and the lower support member 106. Each vertical strut 102 is positioned between the upper support member 104 and lower support member 106 as shown in FIG. 4. As previously described, each vertical strut 102 is aligned with the mounting holes 120 and 122 in the upper support member 104 and the lower support member 106. By way of example, only each vertical strut 102 is secured to the upper support member 104 by a bolt or pin secured to the top portion 114 of the vertical strut 102 (e.g. through mounting hole 120), and at least one bolt or pin secured to the front face 110 or the back face 108. Each vertical strut 102 must also be secured to the lower support member 106. By way of example only, a bolt or pin is secured to the bottom portion 112 of each vertical strut 102 (e.g. through mounting hole 122), and at least one bolt or pin is secured to both the front face 110 and the rear face 108.

The "U"-shaped configuration of the upper support member 104 and the lower support member 106 further prevent each vertical strut 102 from rotating in plae. Although the upper channel 104 and lower channel 106 as shown in FIGS. 4–5 are manufactured from a single piece of sheet metal, it is within the scope and spirit of the invention for the upper support member 104 and lower support member 106 to be manufactured from multiple pieces of material. In a preferred embodiment, and as best shown in FIG. 5, the upper support member 104 and lower support member 106 have a perforated surface. The perforated surfaces of the upper support member 104 and lower support member 106 allow air from a fan/filter unit 150 (FFU) to flow through (see FIG. 10).

When the lower support member 106 is secured to the vertical struts 102 it forms a front mounting surface 118 and a rear mounting surface 116 that various EFEM components may mount to (see FIGS. 6–10). In general, the spine 100 creates at least three parallel and co-linear mounting surfaces; the front face 110 of the upper portion 112, the front mounting surface 118, and the rear mounting surface 116. As will be described later, the EFEM components mount to one of these three surfaces. These three surfaces have a known spacial relationship between them, and thus components mounted to these surfaces may be aligned with minimal adjustments, or require no adjustments at all.

The lower support member 106 also creates an air flow area 121 located between the front mounting surface 118 and the rear mounting surface 116. The air flow area 121 is designed to accommodate a FOUP door open/close module 139 that has been guided away from the port door opening and lowered down into the air flow area 121.

Isolating the FOUP door open/close module 139 from the area the wafer engine 300 operates within has many advantages. For example, a single airflow generated by an FFU 150 is divided into two isolated air flows. One air flow will be directed towards the FOUP door open/close module 139, while a second separate air stream will be directed into the wafer engine area. The two isolated air flows will provide a cleaner environment for the FOUP/port door assembly 139 than if a single air flow was circulated for both the wafer engine area and the FOUP door open/close module 139. If there was only a single air flow path for both the wafer engine 300 and the FOUP assembly 130 particles created by the wafer engine, 300 may contaminate the FOUP/pod door assembly 139.

The rear mounting surface 116 of the lower support member 106 also operates as a protective barrier between the FOUP door open/close module 139 and the wafer engine area. The rear mounting surface 116 prevents particles generated by the wafer engine 300 from entering the air flow area 121 storing the FOUP door open/close module 139. The rear mounting surface 116 also allows the wafer engine 300 to have localized filtering and exhaust systems that exhaust "dirty" air containing particles below the wafer plane while not contaminate the FOUP door open/close module 139 (described hereinafter).

The spie structure 100 as shown in FIGS. 4–5 is configured as a four FOUP I/O port EFEM. It is within the spirit and scope of the invention for the EFEM to include any number of I/O ports. Additionally, the EFEM may include spaces or blank I/O ports located between each I/O port that wafers will be transported through. As previously mentioned, the spine structure 100 is scalable. The number of vertical struts 102, and the length of the support member 104 and the lower support member 106 may be modified to match the I/O port configuration required for the EFEM.

Each vertical strut 102 also has a cam guide 129 machined into the side surface. The cam 124 operates as a track or channel for guiding the FOUP door open/close module 139 rearward away from the FOUP 10 and subsequently downward into the air flow area 121. The movement of the port/pod door assembly 139 may be controlled by a motor assembly (not shown) located within the processing station.

Such a motor assembly is known in the art and does not required further disclosure. It is within the scope and spirit of the invention to mechanically guide and move the FOUP door 12 and port door 140 into the storage area 121.

Figure 6:
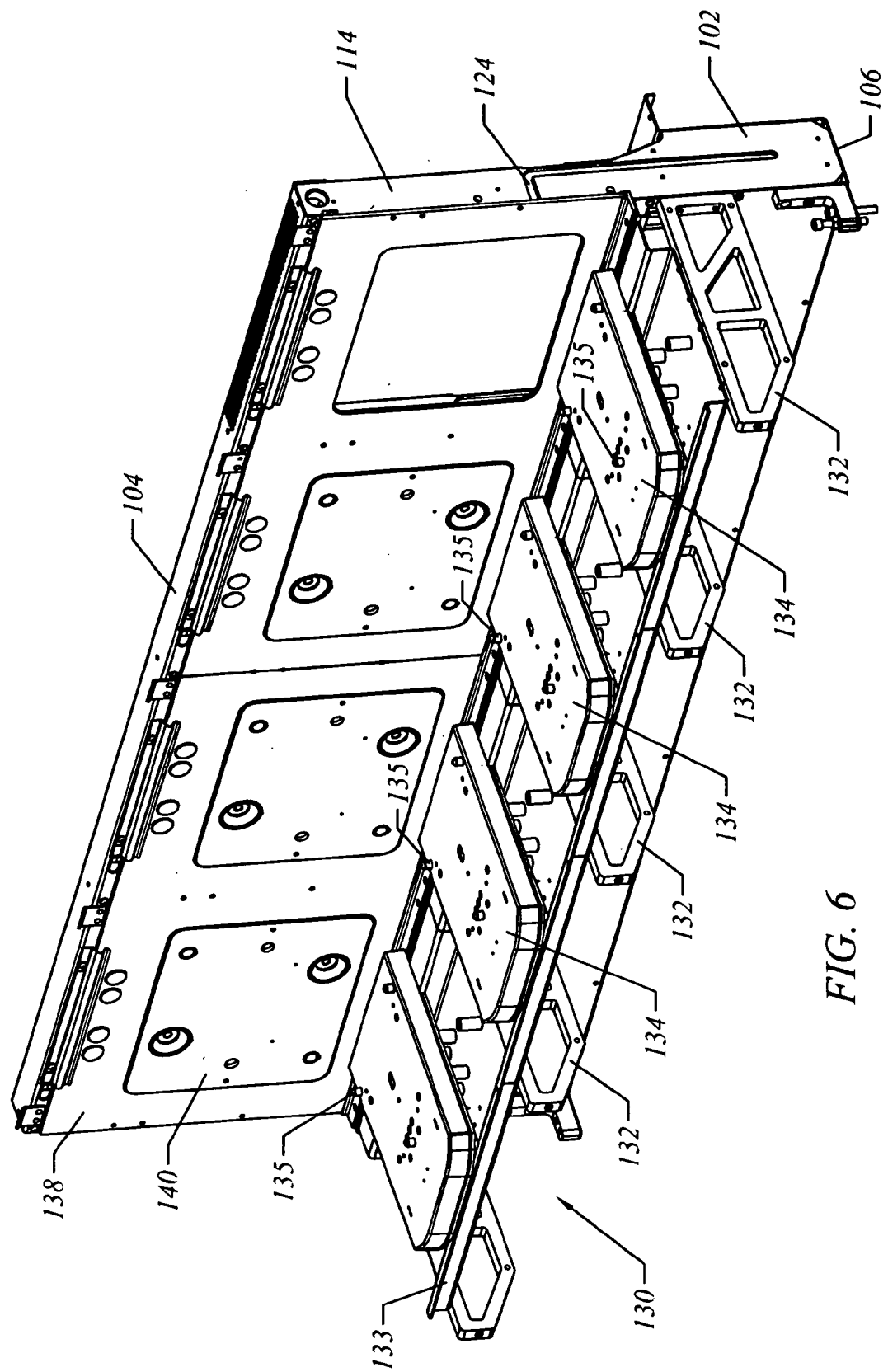
FIG. 6 is a perspective view of an embodiment of a FOUP docking interface, according to the present invention.
Figure 7:
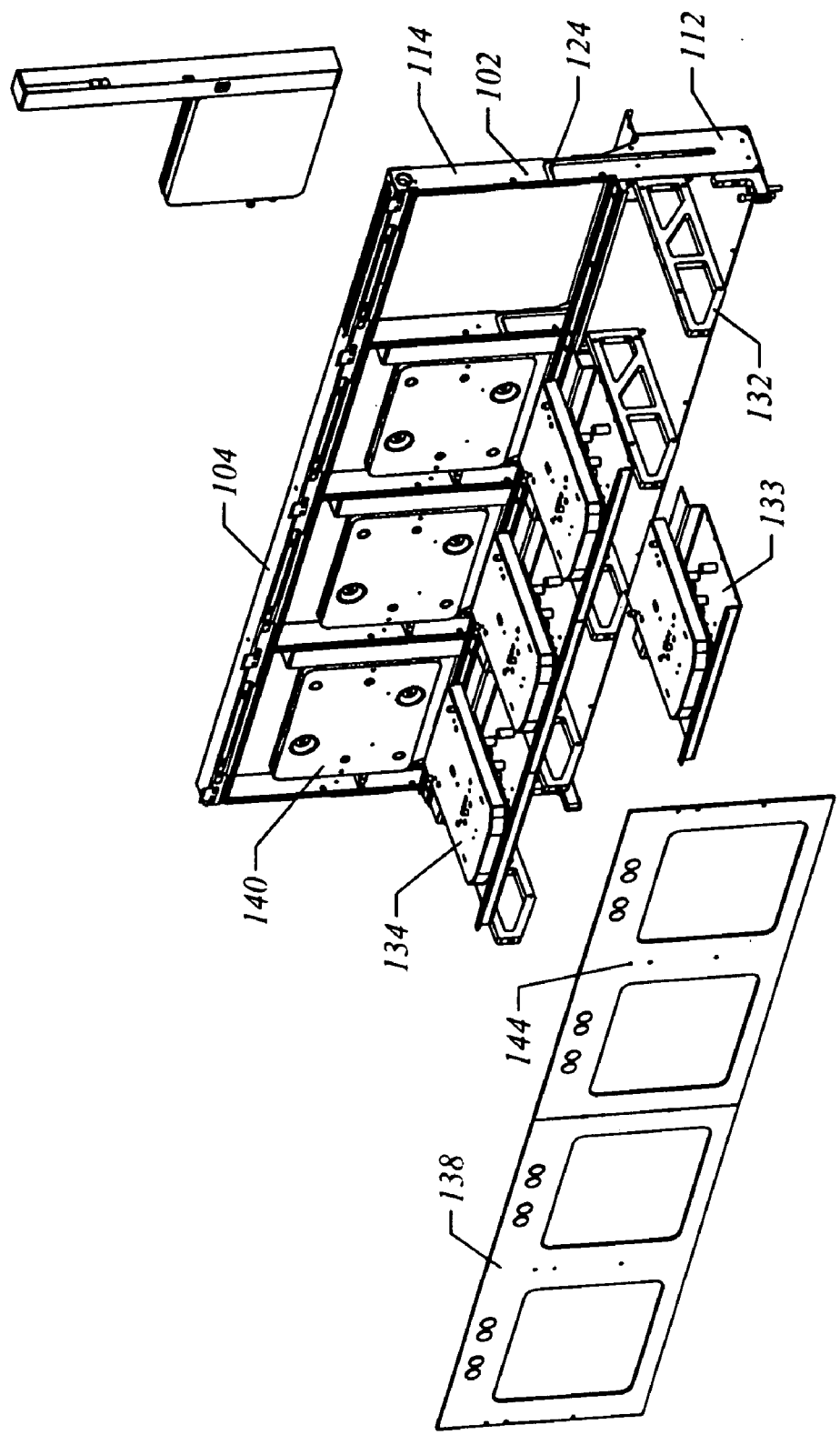
FIG. 7 is a partial exploded perspective view of an embodiment of the spine structure and front end load components, according to the present invention.

The FOUP docking interface shown in FIGS. 6–7 illustrate several EFEM components mounted to the spine structure 100. By way of example only, the components may include a wafer engine or robot 300, a FOUP support assembly 130, a FOUP docking/isolation plate 138, and a port door 140. The FOUP support assembly 130 includes a FOUP advance support 132, a FOUP advance module 133, and a FOUP support plate 134.

In order to transfer the workpieces from the FOUP 10 into the mini-environment (see FIG. 10—"Class-1 Area") a FOUP 10 is manually or automatedly loaded onto the port advance plate 134 so that the FOUP door faces the load port door 140. A conventional load port door 140 includes a pair of latch keys which are received in a corresponding pair of slots in the door latching assembly mounted with the FOUP door. An example of a door latch within a FOUP door adapted to receive an operate with such latch keys is disclosed in U.S. Pat. No. 6,188,323, entitled "WAFER MAPPING SYSTEM," issued to Rosenquiest et al., which patent is assigned to the owner of the present invention, in which patent is incorporated by reference herein in its entirety. In addition to decoupling the FOUP door from the FOUP shell, rotation of the latch keys also lock the keys into their respective FOUP door slots. There are typically two latch key and slot pairs, each of which pairs are structurally and operationally identical to each other.

A pod advance plate 134 typically includes three kinematic pins 135, or some other registration feature, which mate within corresponding slots on the bottom surface of the FOUP 10 to define a fixed and repeatable position of the bottom surface of the FOUP 10 on the advanced plate 134. Once a FOUP 10 is detected on the pod advanced plate 134, the FOUP 10 is advanced toward the port door 140 until the FOUP door lies in contact with or is near the port 140. It is desirable to bring the front surfaces of the respective doors into contact with each other to trap particulates and to insure a tight fit of the port door latch key in the FOUP door key slot. U.S. patent application Ser. No. 09/115,414, entitled "POD DOOR TO PORT DOOR RETENTION SYSTEM," by Rosenquist et al., and U.S. patent application Ser. No. 09/130,254, entitled "POD TO PORT DOOR RETENTION AND EVACUATION SYSTEM," by Rosnight et al. disclose systems insuring a tight, clean interface between the FOUP 10 and port doors. These applications are assigned to the owner of the present invention, and are both incorporated by reference herein in their entirety.

Figure 10:
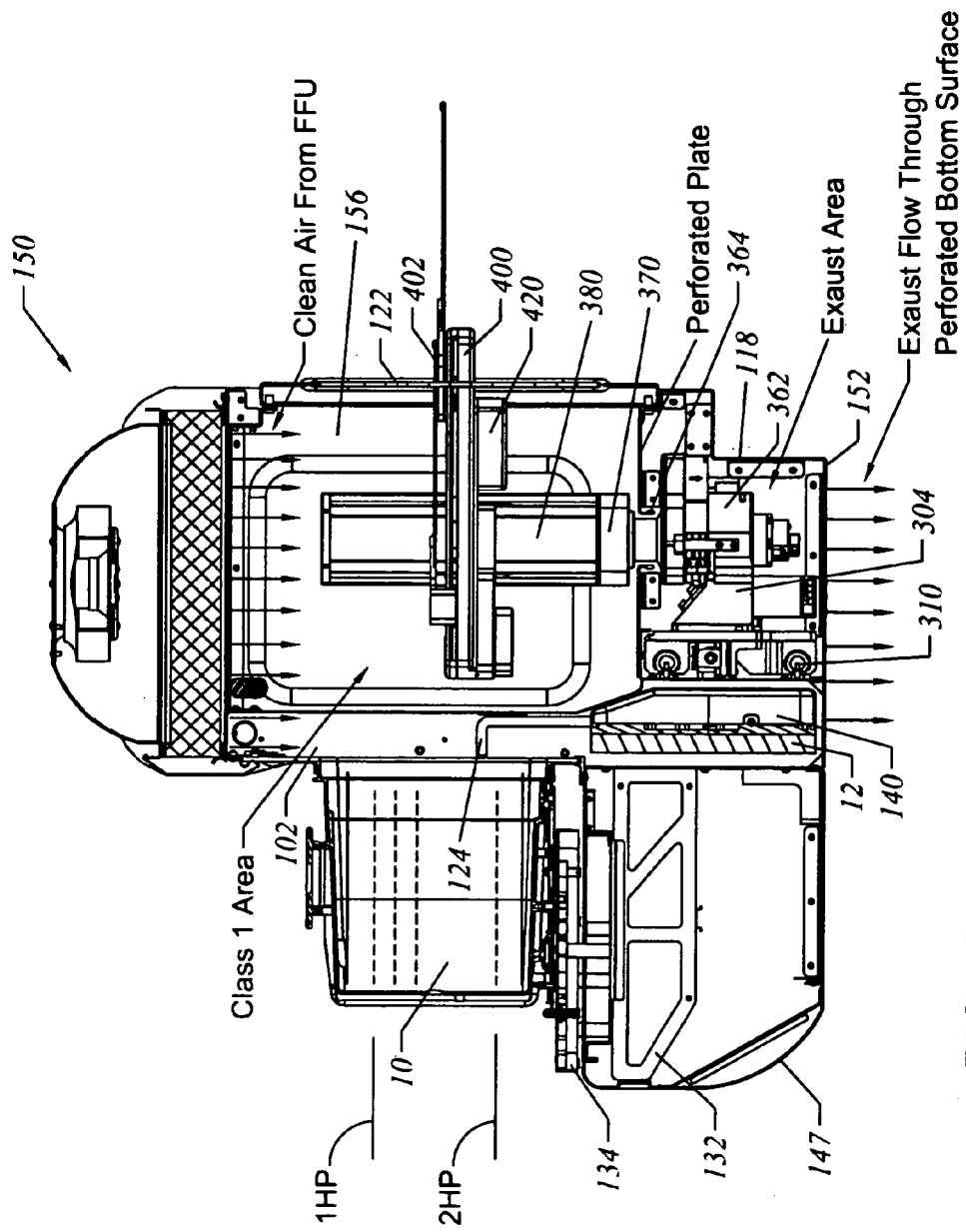
FIG. 10 is a side view of an embodiment of the front end load interface, according to the present invention.

Once the FOUP 10 and port doors are coupled, linear and/or rotational drives with the EFEM move the FOUP 10 and port doors together into the interior of the EFEM, and then away from the load port opening so that the workpieces may thereafter be accessible to the wafer engine 300. As shown in FIG. 10, the port door 140 is affixed to the FOUP door and a controller actuates a slide to translate the carrier and port doors along the cam 124 located in each vertical strut 102. The cam 124 guides the interlocked carrier and port doors vertically down into the air flow area 121 of the lower support member 106. As previously mentioned, the port door 140 and FOUP door are isolated from the rest of the Class-1 area while stored in the air flow area 121. The linear slide and rotational drive configurations (not shown) are known in the art and do not require further disclosure. A linear slide may be comprised of a linear bearing and a drive mechanism. By way of example only, the linear bearing may include a ball or air bearing. Similarly, the drive mechanism may include a motor with a cam lead screw, a belt drive, or a linear motor. The rotational drive may be comprised of, by way of example only, a gear motor, a direct drive, a belt drive, or other similar means.

After the FOUP 10 and port doors are moved away from the docking/isolation plate 138, the wafer engine or robot 300 may transfer workpieces into the tool front end without interference from the stored FOUP 10 and port doors. Once operations on a workpiece lot at the tool have been completed and the workpieces have been returned to the FOUP 10, the controller again actuates the drive and the slide to move the doors back into the I/O port, where upon the FOUP door is transferred and secured to the FOUP 10.

The docking/isolation plate 138 is mounted to the front face 110 of each vertical strut 102. The docking/isolation plate 138 isolates the interior region (Class-1 or "clean" area) of the tool front end from the outside ambient or exterior region. The docking/isolation plate 138 also provides an interface plane that the FOUP 10 is advanced towards to a close and controllable proximity (e.g., 0–5 mm separation). The plate 138 forms an auxiliary seal with the FOUP 10 and the port door 140. An auxiliary seal allows a separation to exist between the plate 138 and the FOUP 10, but still creates an airtight seal between the plate 138 and the FOUP 10. An airtight seal between the plate 138 and the FOUP 10 is desirable to prevent gas from leaking out of the Class-1 Area or to maintain the inert environment of the load port interface.

The docking/isolation 138 is preferably manufactured from a single piece of material that includes one or more FOUP openings machined into it. The docking/isolation plate 138 includes registration holes 144 to locate it accurately with respect to each vertical strut 102. This provides a machined, precision relationship between all the FOUP 10 openings for the EFEM. The docking/isolation plate 138 may also comprise individual pieces of material that mount to each vertical strut 102 using the same reference features. The plate 138 may be fabricated from materials such as, but not limited to, plastic, metal, sheet metal, or even glass.

In a preferred embodiment, the docking/isolation plate 138 is machined from a clear material, such as polycarbonate. Machining the docking/isolation plate 138 from a clear material provides an added benefit of being able to see inside the mini-environment or Class-1 Area while the tool is in operation. The current E15 load port/SEMI E63 bolts Interface does not define this feature. The docking/isolation plate 138 does not have any structural features and therefore may be secured to each vertical strut 100 of the spine 100 by only a few bolts and/or pins. Thus, the docking/isolation plate 138 may be easily removed. Further, since none of the EFEM components align with reference to the docking/isolation plate 138, the docking/isolation plate 138 may be removed from the EFEM without disturbing the set up or alignment of the EFEM components such as the door port 140, the FOUP advance plate 134, or the wafer engine 300. This provides a simple method of gaining access to the "clean" area (Class-1 area in FIG. 10) of the EFEM for service, maintenance, or error recovery.

Figure 8:
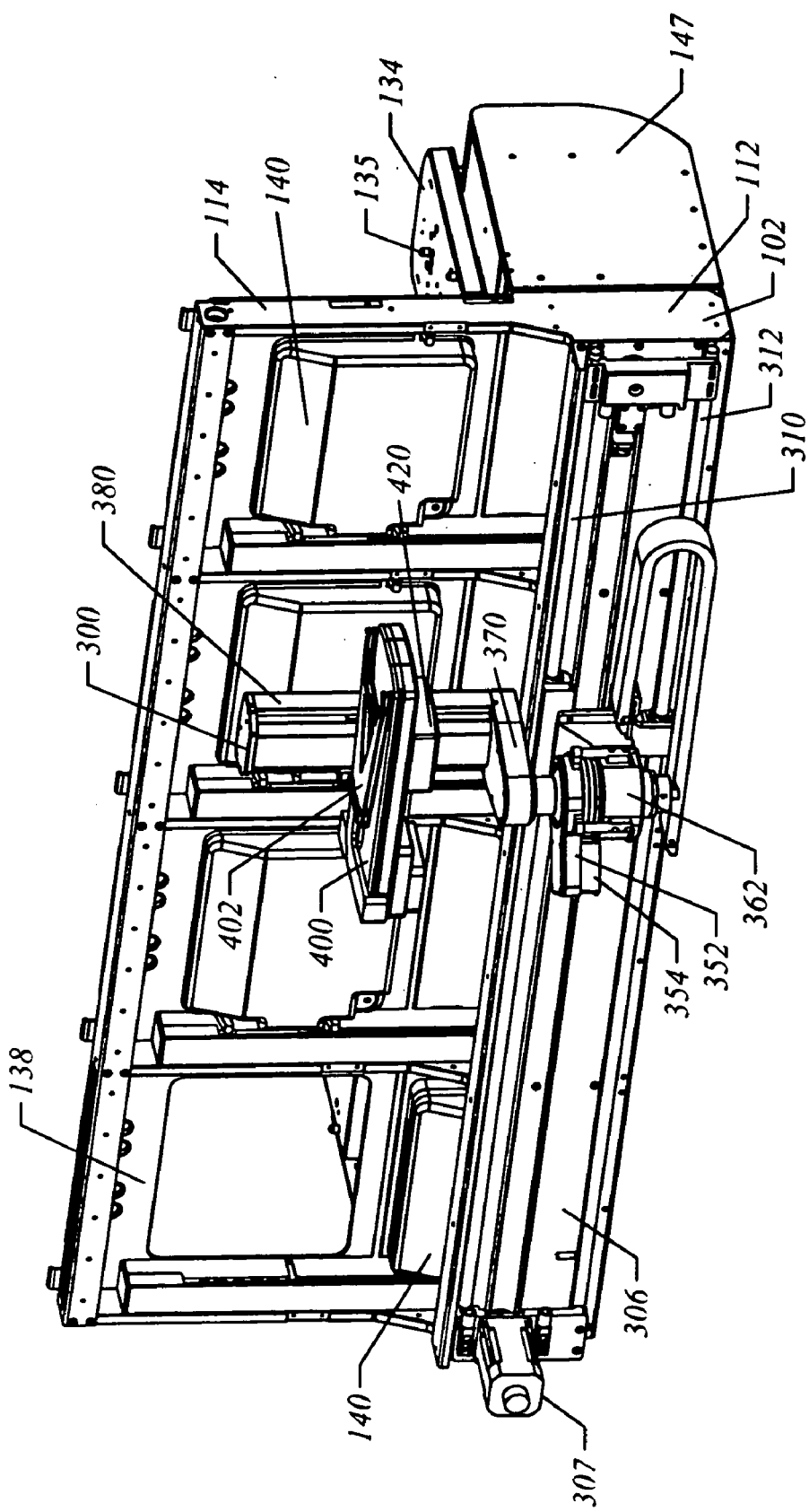
FIG. 8 is a perspective view of an embodiment of a wafer engine mounted to the spine structure, according to the present invention.

FIG. 8 illustrates the wafer engine 300 mounted to the spine structure 100. From this view, it is clearly shown that the wafer engine 300 may travel linearly to access all the I/O ports of the EFEM. The wafer engine 300 travels along a rail assembly 302, which is mounted to the rear mounting surface 116 of the lower support member 106. In this embodiment, the linear drive 302 is shown as a belt drive. It is within the scope and spirit of the invention for the linear drive 302 to comprise other drive systems such as, but not limited to, a direct drive, a linear motor, a cable drive, or a chain link drive. The components of the wafer engine 300 will be described later. Such drive systems are well known in the art and do not require further disclosure.

Figure 9:
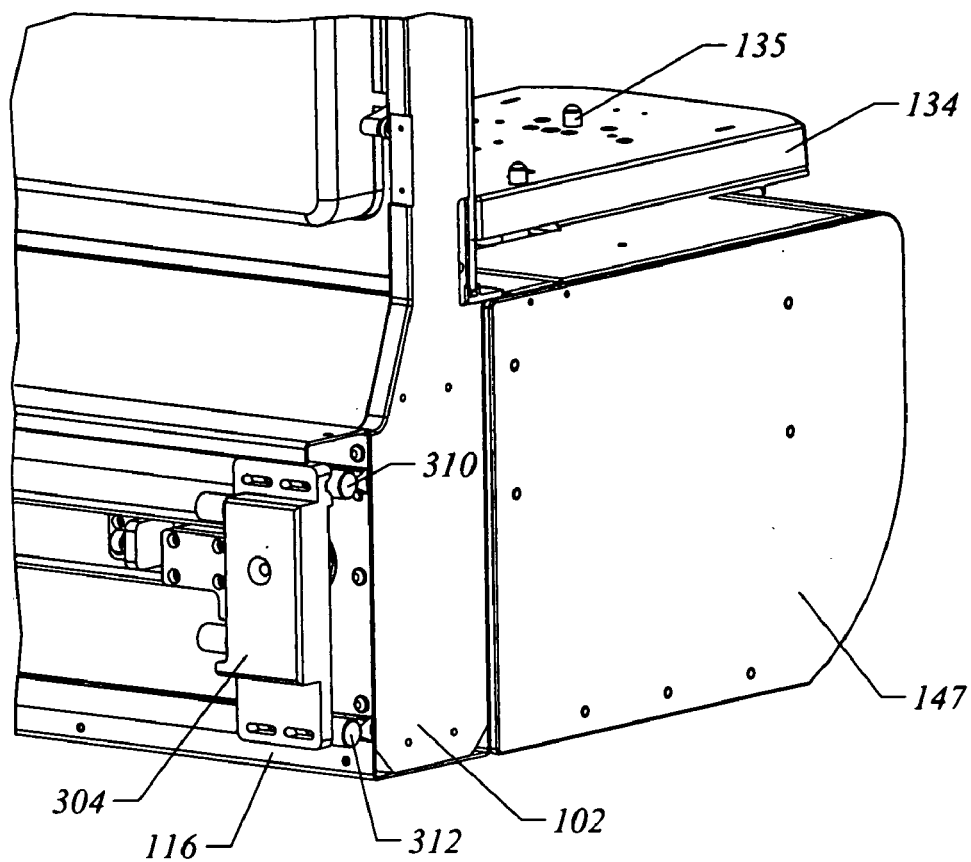
FIG. 9 is a perspective view of an embodiment of a wafer engine drive rail mounted to the spine structure, according to the present invention.

FIG. 9 illustrates further detail of the rail system 302 shown in FIG. 8 mounted to the spine structure 100. The rail system 302 includes an upper x rail 301, a lower x rail 312, and a carriage guide 311, all mounted to the rear mounting plate 118 of the lower channel 106. In a preferred embodiment the upper x rail 310 and the lower x rail 312 are circular or tubular, and are substantially parallel to each other. Engaging the upper x-rail 310, the lower x-rail 312, and the carriage guide 311 is an x carriage 304. The upper and lower x rail 312 and 312 also serve as the main support for the wafer engine 300.

FIG. 9 also illustrates a control box 147 that is preferably located below the FOUP advance assembly 130. The EFEM requires many electrical control device (e.g., control wiring, PCBs, etc.). It would be an advantage if these devices were easily ccessible for maintenance and repair. The control box 147 provides an area to mount the electrical devices. In a preferred embodiment, the control box 147 has a pivoting front cover that may drop down for access to the electrical components inside. Within the control box are located many of the electrical components and control systems required to power and operate the EFEM components. It is intended that these electrical components may be easily accessed for maintenance purposes and therefore the pivoting front cover of the control box 147 is secured by a few bolts and/or pins that may be removed and allow the front cover to pivot downwards towards the floor of the fab.

As shown in FIGS. 10, and 30–31, the spine structure 100 architecture provides a way to minimize the footprint of the EFEM and seal the clean volume of the system while still maintaining overall system accuracy. The FFU 150 mounts to and seals with the upper channel 104 and a tool interface panel 154 to form the top of the EFEM. The front seal is provided by mounting the docking/isolation plate 138 to the front face 110 of each vertical strut 102. A sheet metal panel 152, which is preferably a perforated surface, mounts to the lower support member 106 to form the bottom of the EFEM. The panel 152 also acts as an exhaust plate that allows the exhaust flow from both the FFU 150 and the wafer engine 300 to pass out into the ambient environment. Each side of the EFEM is sealed by end plates 156 which mount and seal with the spine 100 (see FIG. 30), the tool interface panel 154, the panel 152, and the FFU 150. As shown in FIG. 10, the clean air flow from the FFU 150 and the slide body FUF 420 travel through the mini-environment, or Class-1 area, and out through the bottom panel 152 and the lower channel 106. The airflow exhausted from the Z slot fan 354 (described hereinafter), which contains particles generated by the vertical drive 380, also travels through the bottom panel 152. The airfrow from the Z slot fan 354 never enters the clean mini-environment.

In general, the spine 100 creates a single reference system to calibrate and align the EFEM components, such as the wafer engine 300 and the FOUP advance assembly 130. Each separate EFEM component may calibrate to a known and fixed position, such as a vertical strut 102 instead of calibrating and aligning with respect to each other. This method of calibration is greatly simplified over the conventional procedures required today.

Spine Structure with a Backbone

Figure 11:
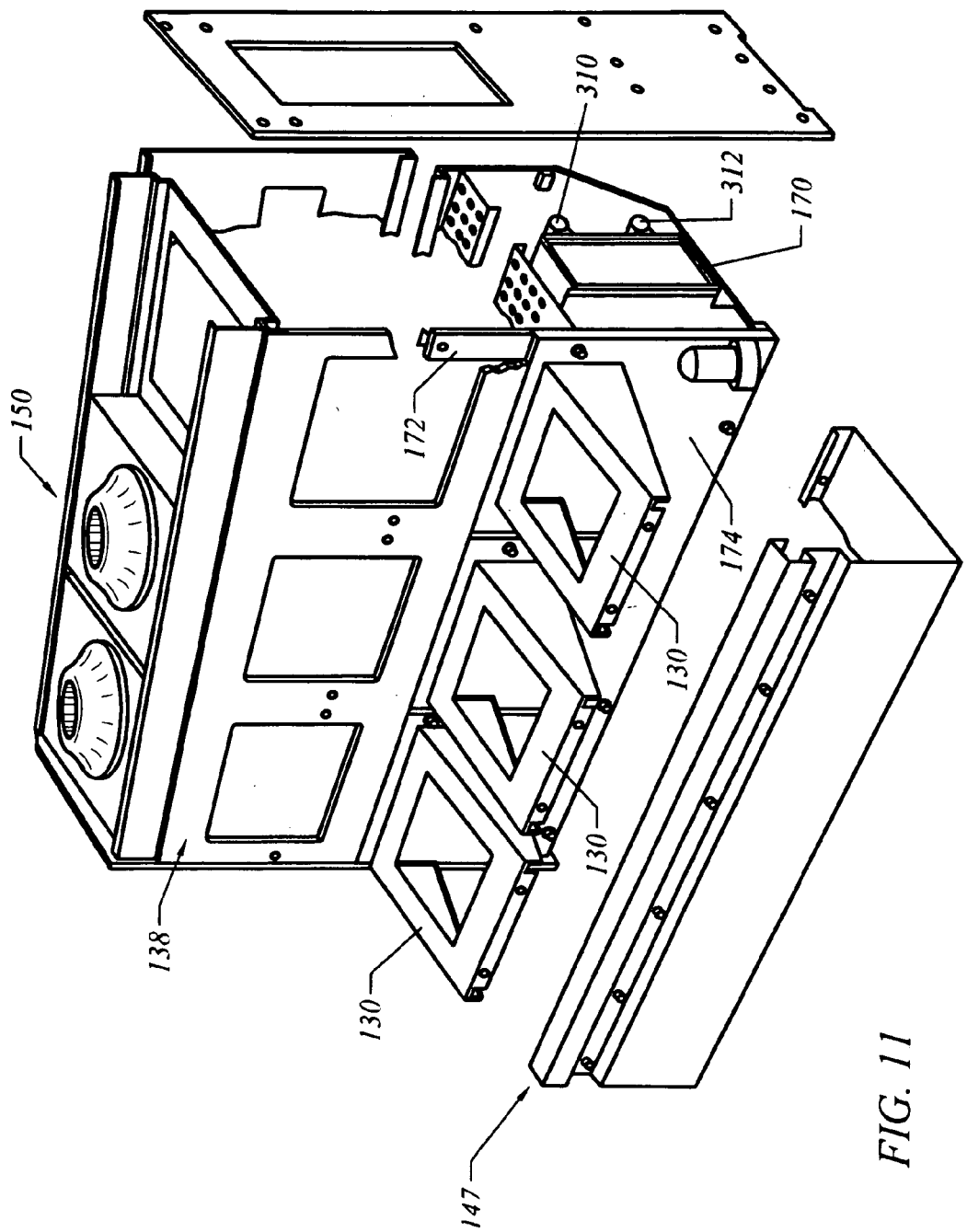
FIG. 11 is a partial exploded view of another embodiment of the integrated mini-environment and structure, according to the present invention.
Figure 12:
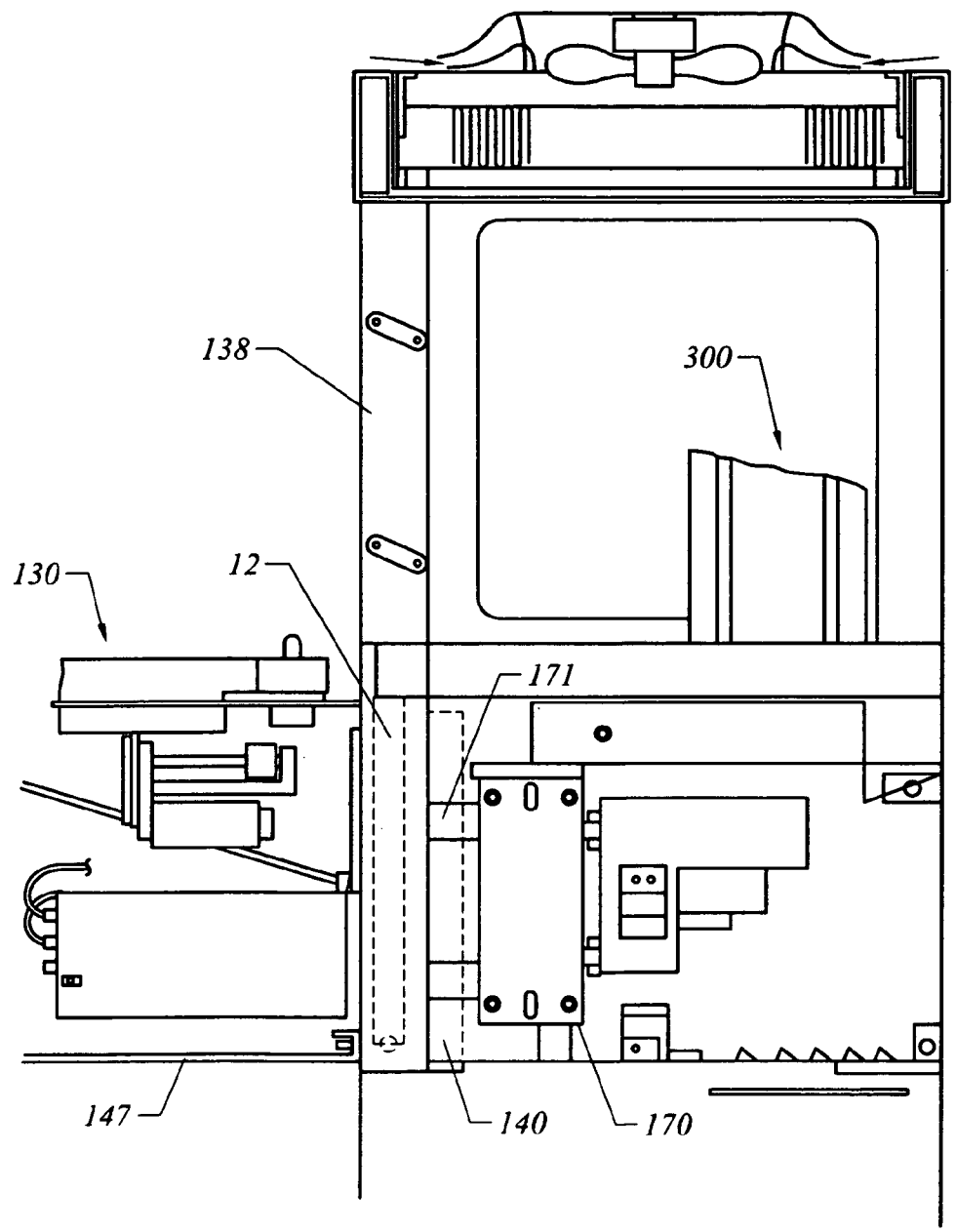
FIG. 12 is a side view of the integrated mini-environment and structure as shown in FIG. 11.
Figure 13:
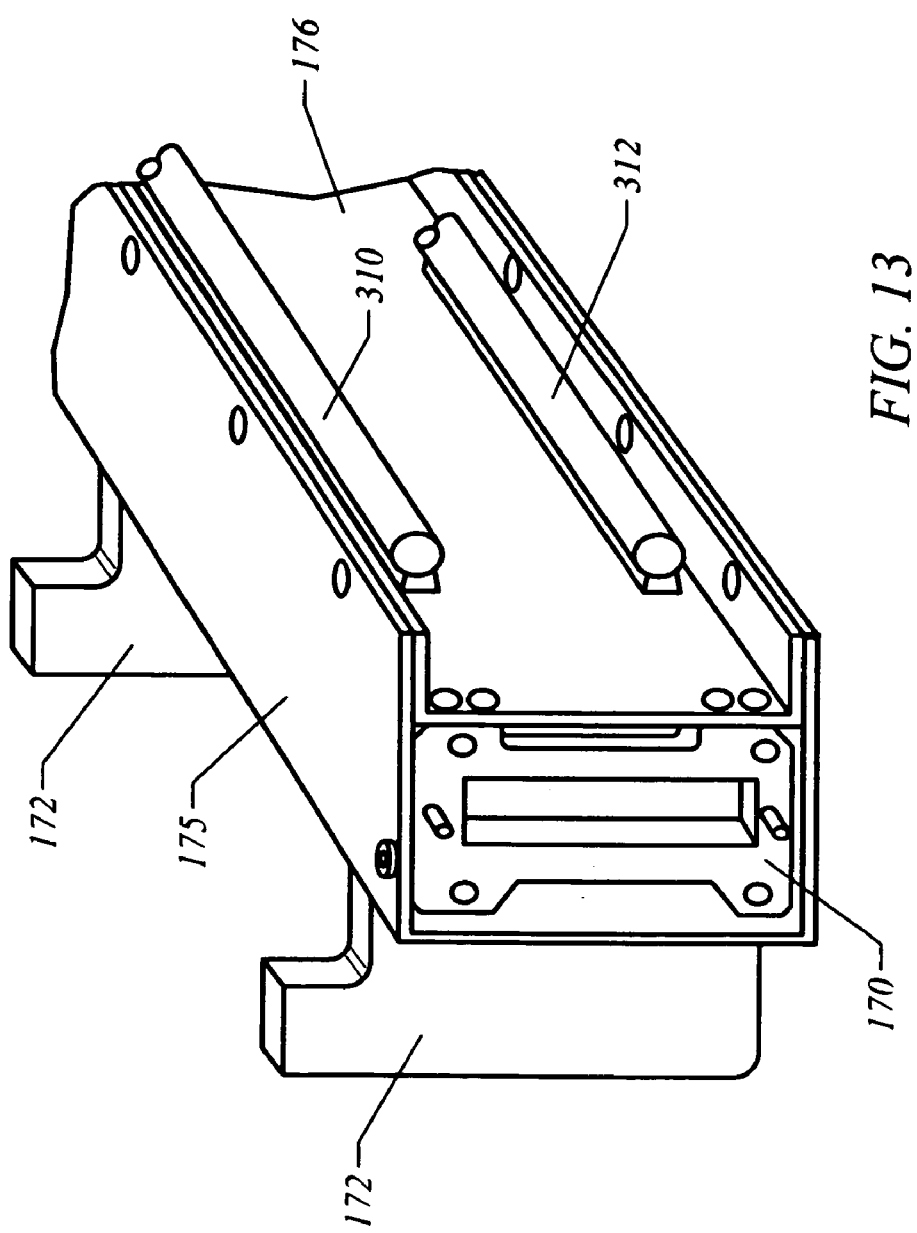
FIG. 13 is a partial perspective view of an embodiment of the backbone structure according to the present invention.

FIGS. 11–13 illustrate another embodiment of a spine structure. The primary structural elements of this embodiment include a horizontal beam 170, registration struts 172, and a front mounting plate 174. As shown in FIG. 11, the horizontal beam 170 is preferably mounted to the bottom portion of each registration strut 172 to form a rigid frame. The front mounting plate 174 is also mounted to each registration strut 172, providing a surface for the exterior EFEM components (e.g., FOUP advance assembly 130) to mount to. The horizontal beam 170 may be manufactured from, by way of example only, an aluminum extrusion, steel tube, a structure made from bent sheet metal, a flat plate, a laminated plate, or most likely a combination of some of the above. The horizontal beam 170 also provides a surface for the linear drive 306 (described hereinafter) to mount to. Similar to the spine structure 100, this embodiment provides a single reference to mount and align EFEM components.

FIG. 12 illustrates that the FOUP door 12 and the port door 140 are preferably still stored in an isolated area within the Class-1 Area. Accordingly, the beam 170 must be spaced apart from the registration struts 172 far enough to allow the FOUP door 12 and the port door 140 to fit between the beam 170 and the registration strut 172. As shown in FIG. 12, separators 172 are placed between each registration strut 172 and the beam 170 to create the storage area. It is within the scope and spirit of the invention to create the storage area through other means. The beam 170 also functions as a protective barrier, preventing particles created by the wafer engine 300 from contaminating the FOUP door 12 or the port door 140.

FIG. 13 illustrates that the support structure or spine may include the beam 170 having a CNC milled aluminum plate 176 mounted to the beam 170 for supporting the x-axis rails 310 and 312. This structure is further rigidified by a sheet metal U-shaped section 175. The vertical registration struts 172, which are mounted to the section 175, are aligned similarly to the vertical struts 102 in the previous embodiment. As shown in FIG. 11, a front mounting plate 172 mounts to the registration struts 174. EFEM components, such as the FOUP advance assembly 130, mount to the front mounting plate 172.

The beam 170 may be positioned between the wafer engine 300 and the pod openers below the work space of the wafer handler. The beam 170, however it is constructed, provides one structural common element that the EFEM components precisely mount to, eliminating the need for time consuming adjustments in the field when an EFEM is installed or replaced.

Single Frame/Shell

Figure 14:
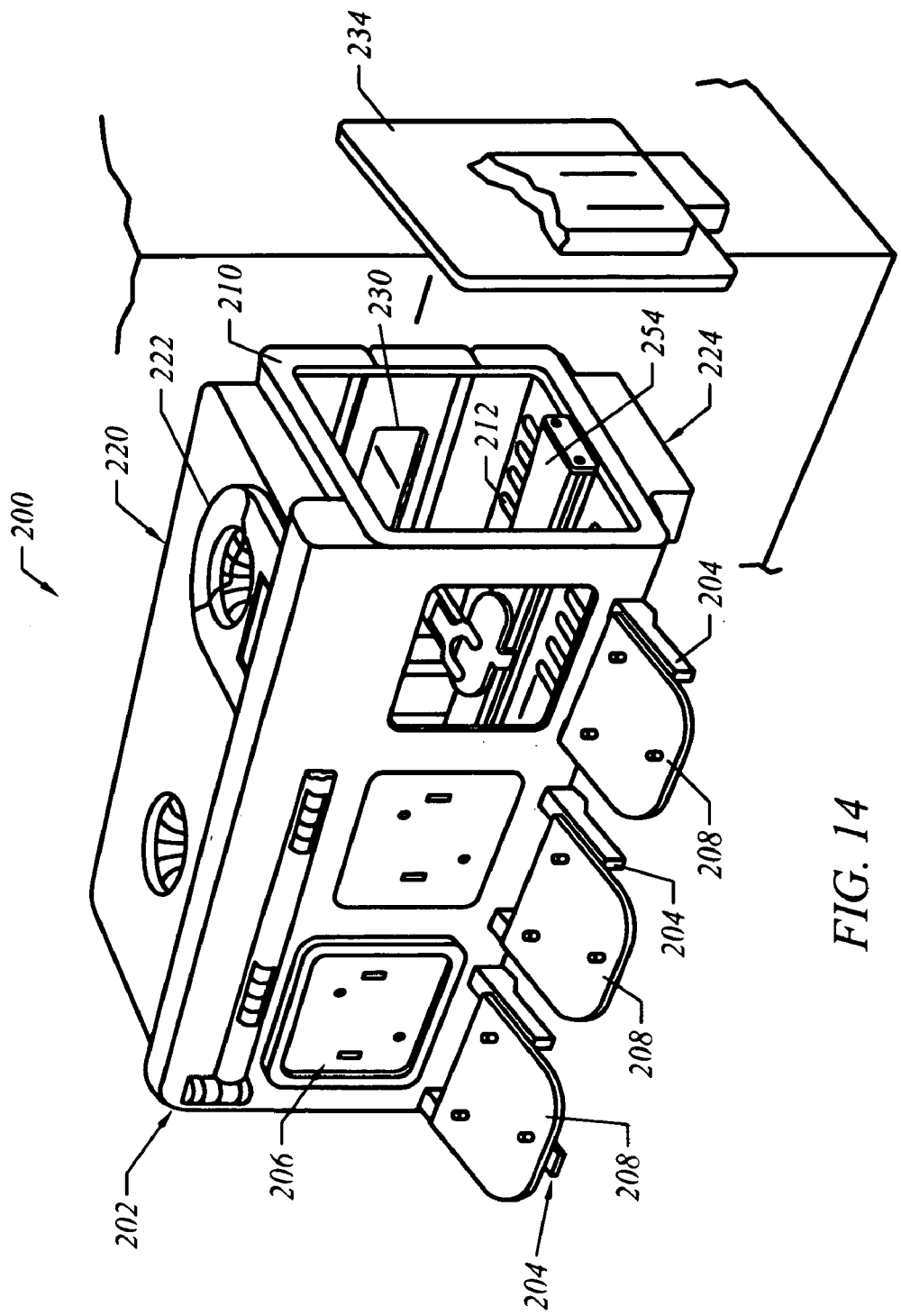
FIG. 14 is a perspective view of still another embodiment of the integrated mini-environment and structure, according to the present invention.
Figure 15:
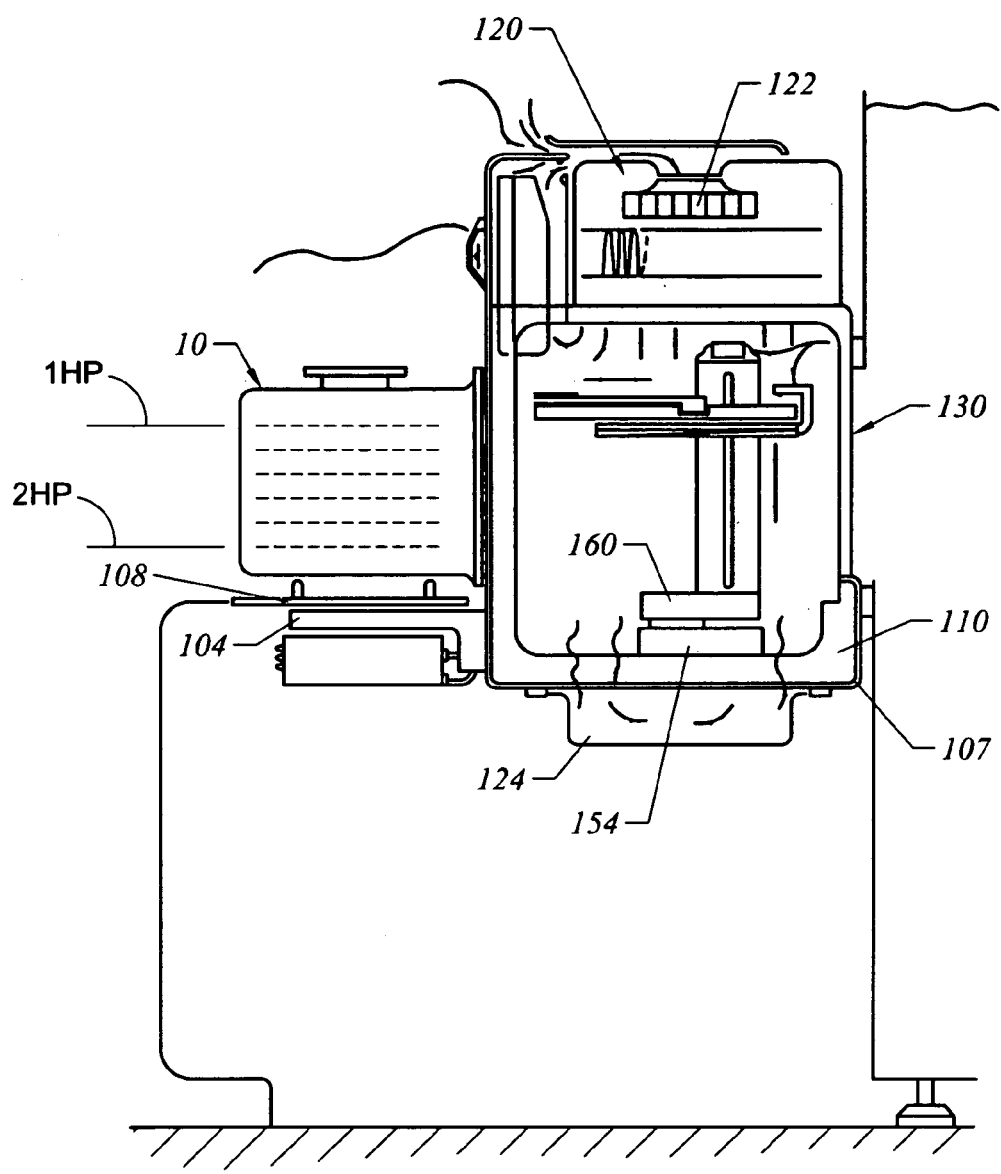
FIG. 15 is an end view of the integrated mini-environment and structure shown in FIG. 14.
Figure 16:
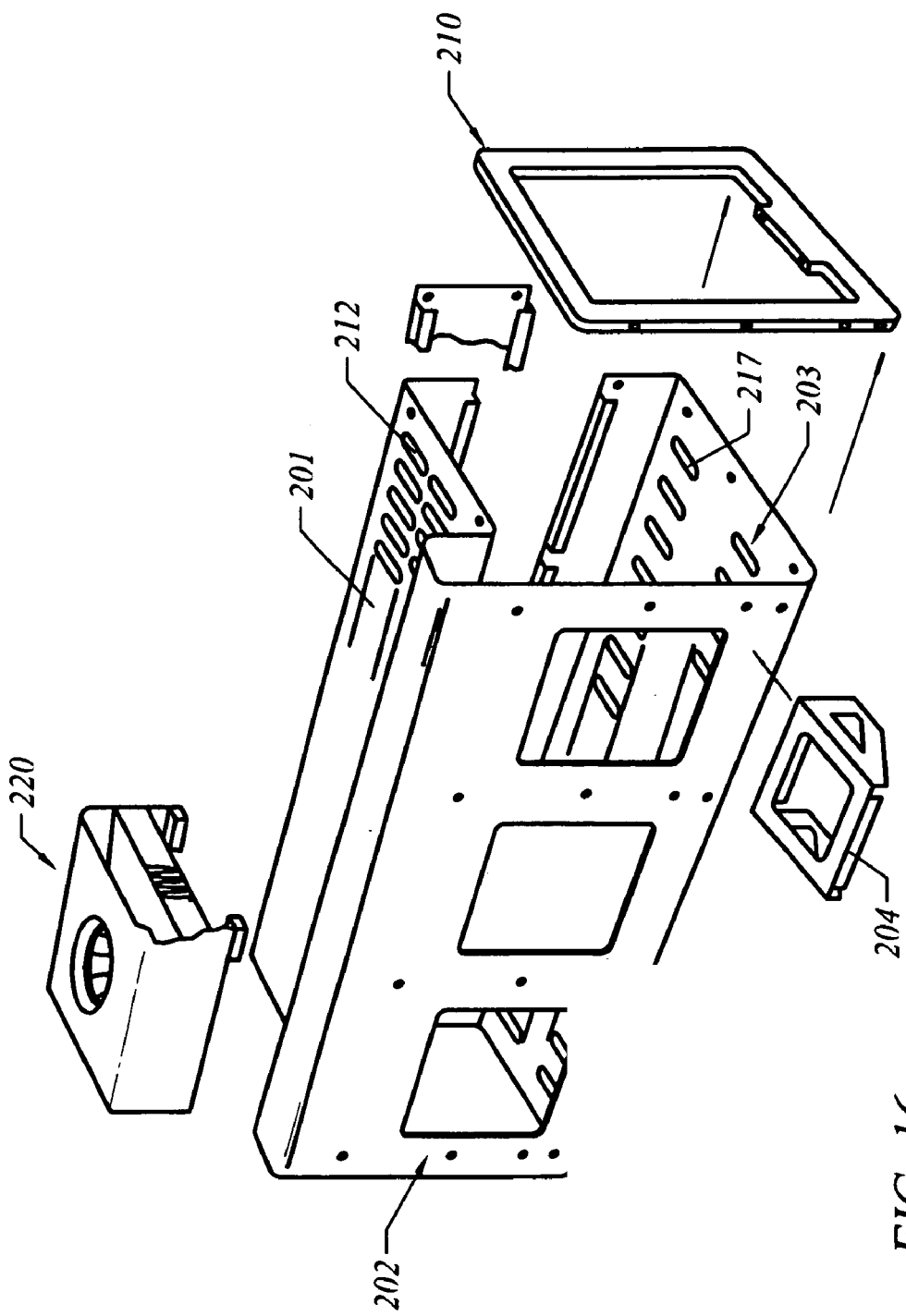
FIG. 16 is a partial exploded view illustrating an embodiment of the unitized frame of the integrated mini-environment and structure shown in FIG. 15.

FIGS. 14–16 illustrate yet another embodiment of the spine structure configured as a FOUP docking station. In this embodiment, the spine structure that the EFEM components mount to is a single frame or shell 202. The frame 202 serves as a single reference for the interior, (e.g., engine wafer 300) and exterior components to mount to and align with (e.g., FOUP advance assembly 130) components similar to the spine structure 100.

As shown in FIG. 14, the spine structure 200 includes three load port assemblies 204 mounted to the frame 202. Each load port assembly 204 is similar to the load port assembly 130 disclosed in the preferred embodiment. A load port door 206, which isolates the Class-1 area from outside ambient conditions, corresponds to each load port assembly 204 for engaging and removing the FOUP door from the FOUP shell. It is within the scope and spirit of the invention for the frame 202 to have more of fewer I/O ports. Similarly, the frame 202 may include a filled-in or solid I/O port located between I/O ports where wafers are transferred through.

The frame 202 is preferably formed from a single piece of material. By way of example only, the frame 202 may be created by a punch press. The frame 202 may be manufactured from many different materials. By way of example only, the frame 202 may be manufactured from material such as, but not limited to, sheet metal, polypropylene, composites, or plastics. The frame 202 may also include an anodized surface finish to prevent or reduce outgassing. Whether the frame 202 is manufactured from a single piece of material or separate parts, the frame 202 is scalable. Accordingly, the frame 202 may be customized to create as many FOUP I/O ports as necessary for the EFEM.

FIG. 15 illustrates several of the EFEM components mounted to the frame 202. The preferred embodiment of the frame 202, which is manufactured from a single piece of stainless steel, is flexible. By way of example only, the frame 202 may also be manufactured from an aluminum sheet. The EFEM must be rigid enough to provide accurate support and alignment points for the EFEM components. Additional supports 210 are mounted to the frame 202 to provide rigid and accurate support points for components such as the lienar drive 254, filter unit 220, FOUP advance assembly 208, and tool interface plane.

To promote air flow through the load port interface, the top surface 201 and the bottom surface 203 of the frame 202 are perforated. A fan/filter unit 220 may be mounted to, and form a seal with, the top surface 201 of the frame 202 to control the rate and quality of the air through the frame 202. Such fan/filter unit technology is well known in the art and does not require further disclosure. A single fan/filter unit 220 may be appropriate to achieve the air flow rate desired. However, as the frame 202 increases in size and thus volume, the frame 202 may require multiple fans to maintain the desired environmental conditions. If the interior of the EFEM is not isolated from outside atmospheric conditions (not an inert environment), air may be drawn into the clean mini-environment by the FFU 220 and vented out through the perforated holes 212 in the bottom surface 203 of the frame 202.

If the EFEM is an inert system, a flow capture chamber 224 may be mounted to and sealed with the bottom surface 203 of the frame 202 so that the air flow created by the fan/filter unit 220 is completely contained and re-circulated. The end cap 210 may also have a flow return path guiding the air exiting the flow capture plenum 224 back to the fan/filter unit 220 for re-circulation.

Due to the minimal enclosed volume created by the frame 202 the present invention is a very efficient system from an air handling standpoint. A mini-environment with a smaller vume of air to control and filter makes it easier to maintain the cleanliness of the air. Inert systems, or systems requiring molecular filters which degrade as more air push through them, also benefit from a mini-environment containing a smaller volume of gas. By way of example only, filters will require changing less frequently if a smaller volume and rate of gas is passed through them.

System Volumetric Space Utilization

One of the key differentiators of all of the EFEMs previously described (e.g., spine structure, backbone, and frame) is the fundamental change in space utilization. The space utilization feature will only be referenced to the spine structure 100 even though this concept applies to all the embodiments disclosed in this application. In conventional tool front ends, the front end occupies all space from the front of the load port (load face plane) to the process tool face, and from the floor of the fab up to its highest point, typically the top of the FFU and the full width of the front end.

An EFEM constructed from the spine structure 100 creates significant space below the load ports 130, and the clean wafer engine area may be given back to the process/metrology tool or used for other purposes. Additionally, the overall depth of the enclosed area or mini-environment is also decreased from what conventional EFEM configurations require. The front of the wafer engine radial slide body 400 may be rotated into the typically unused area for the FOUP door mechanism resides between the vertical struts 102. The space may be given back to the process tool as well as the end user who may realize lower foot print requirements for the overall tool. The configuration of the wafer engine 300 takes advantage of these new and smaller space constraints. For example, the radial slide 400 may reach further into the process tool than a non-offset version.

As a result of the much smaller envelope of the system it is considerably lighter, and if mounted on the independent rolling frame, may be rolled away from the process tool to provide direct access to the tool. Since the system is also shorter than typical process tools, the space above it may be used for other purposes as well, such as local FOUP 10 buffering for the AMHS system. With conventional overhead hoist AMHS systems, local buffer stations may only be placed between load ports or tools since they require unobstructed overhead path to the load port. With the slide out shelf arrangement, the material could be stored in an otherwise unutilized area directly above the enclosed area of the integrated EFEM.

As shown in FIGS. 30–31, the system may be integrated with the process tool in several ways. It is designed to require support at four points. Two points in the front at the base of the two outer vertical struts provide attached and leveling points. Two points at the rear lower corner of each end plate provide the rear support locations. The support points could be provided by a roll out frame which would provide an easy way to move the system away from the process tool. It could be supported by frame members from the process tool which could be cantilevered out from the tool or supported from the floor. It might also be a combination of the two where the roll out frame could be used to lift the system off kinematic points provided by the process tool frame.

Any of the integrated mini-environments and structures 100 or 200 as previously described mount to the front of a tool associated with a semiconductor process. As used here, such tools include, but are not limited to, process tools for forming integrated circuit patterns on semicondutor wafers, metrology tools for testing various properties and work pieces, and stockers for large scale storage of work piece carriers. As used herein, a tool may be simply an enclosure so that the work piece handling on the back side of the plate as described hereinafter may be carried in an enclosed space. By way of example only, the structure 100 according to the present invention may comprise a sorter for arranging and transferring work pieces with one or more carriers.

Figure 1:
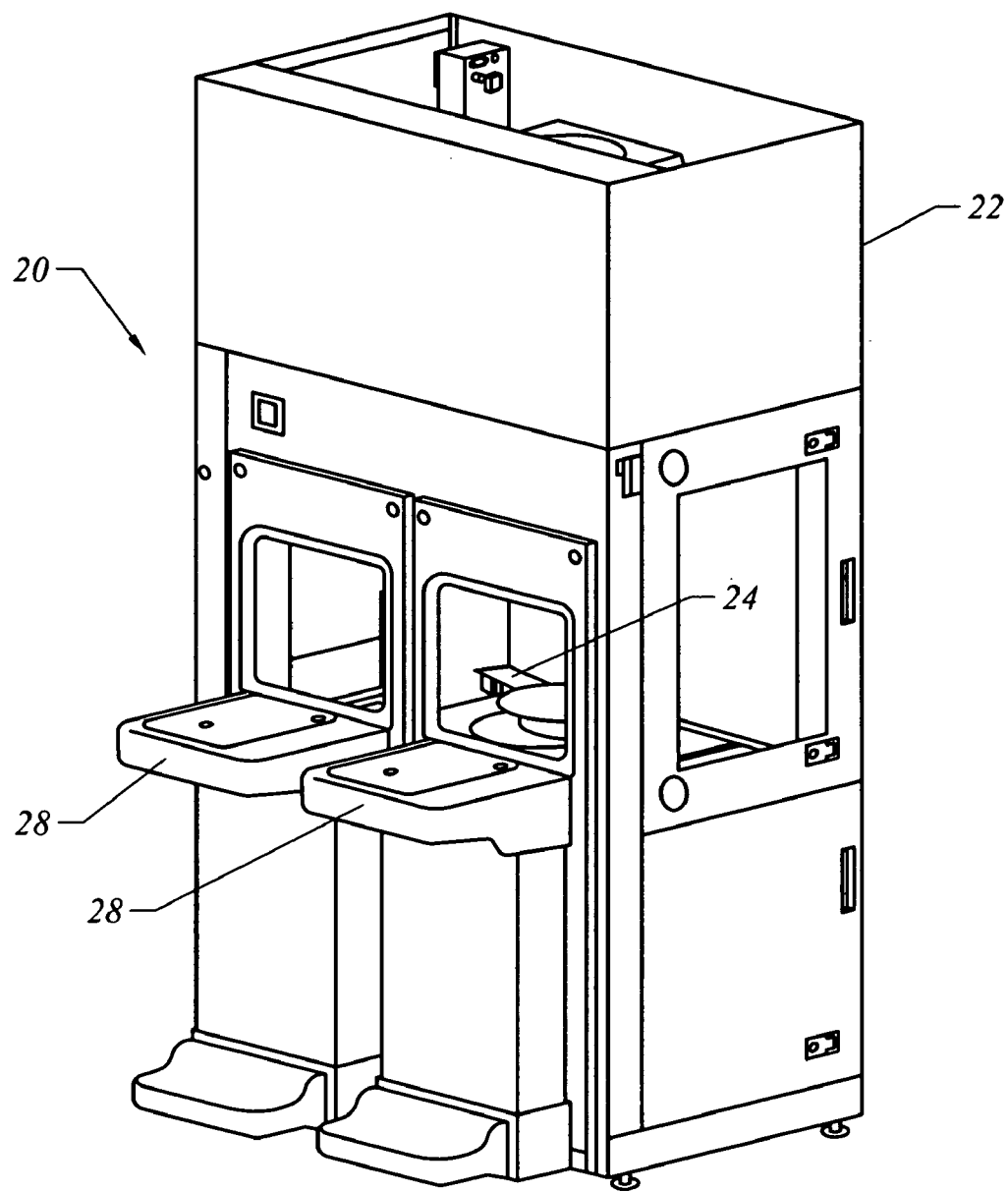
FIG. 1 is a perspective view of a conventional front end assembly in accordance with the prior art.
Figure 2:
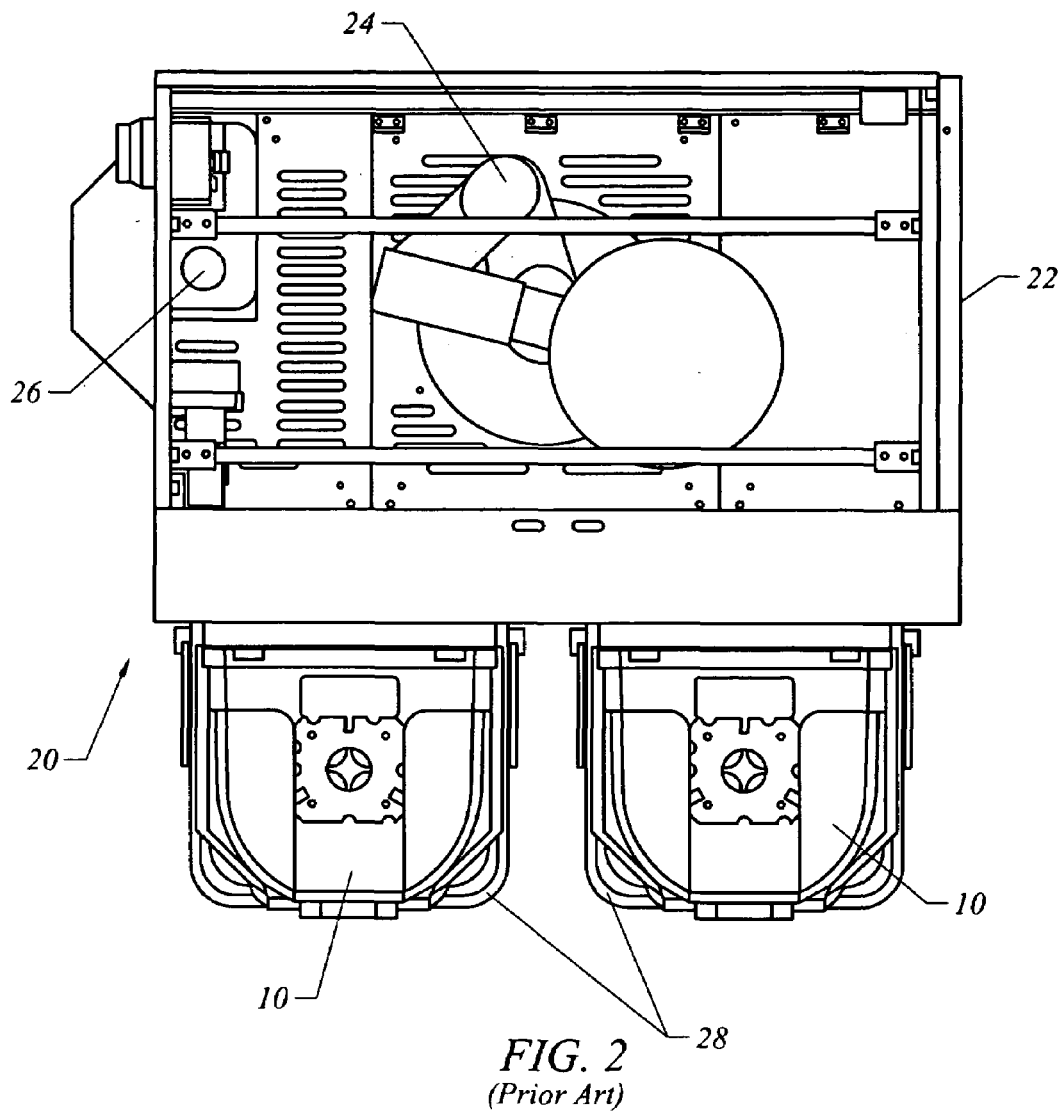
FIG. 2 is a top view of the front end assembly shown in FIG. 1.
Figure 3:
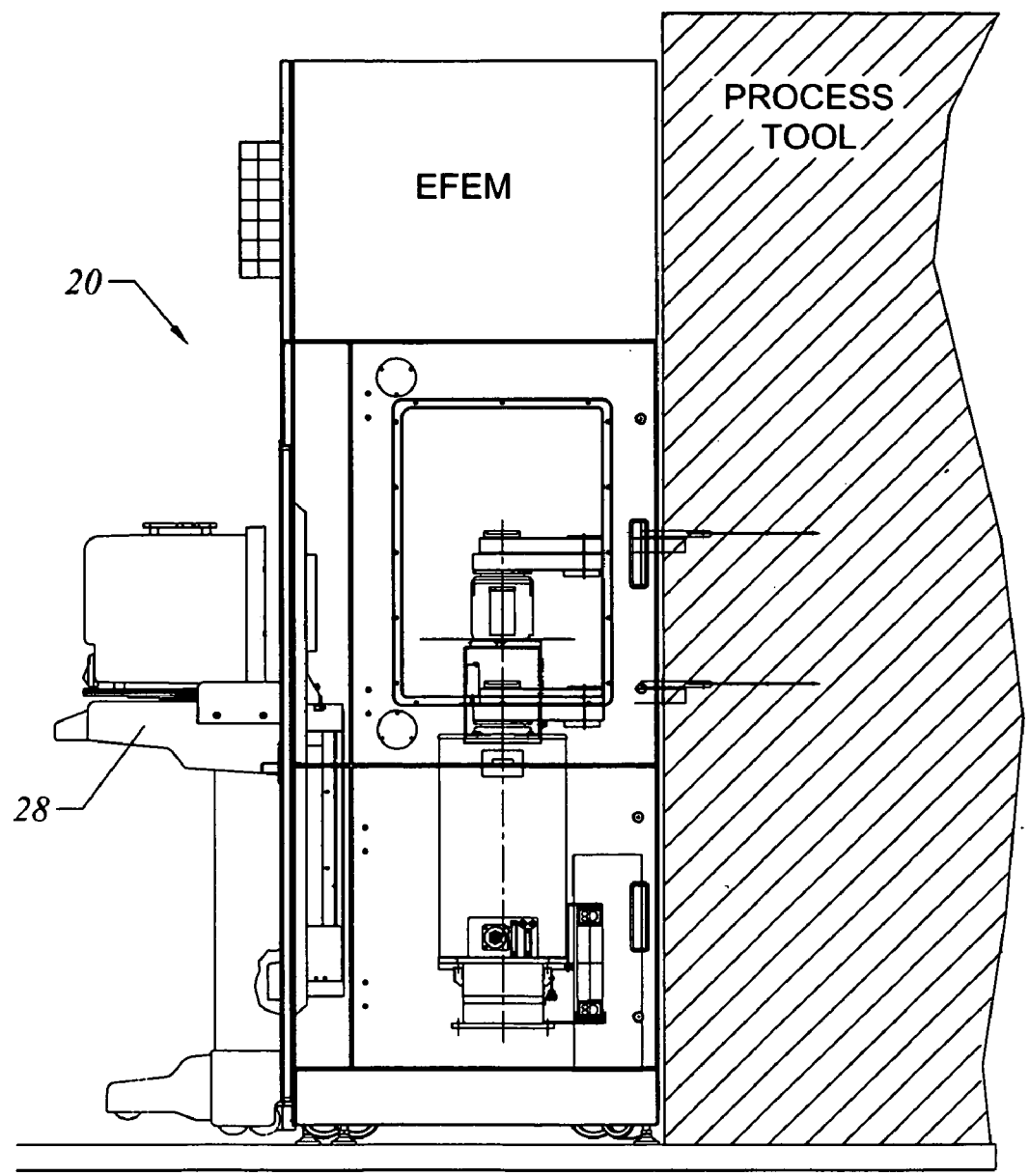
FIG. 3 is a side view of a conventional front end assembly in accordance with the prior art.

Alternatively, the structures 100 may comprise a sorter or a stand-alone prealigner. In both the sorter and stand alone prealigner embodiments, the work piece operations are carried out entirely by the EFEM components mounted to the structure 100. The enclosure that forms the Class-1 Area is also based from the structure 100 provides an enclosed, clean environment in which the work pieces may be handled. In several embodiments of the present invention, the structure 100 may be considered as being part of the tool (see FIG. 3A). In other embodiments of the present invention, the system may be affixed to but considered separate from the tools (FIGS. 29A–29D).

As best shown in FIG. 10, the FOUP docking station is formed around the spine 100. A bottom pan 118 is secured to, and forms a seal with, the bottom support member 106. In a preferred embodiment, the bottom pan 118 is perforated surface to allow air from the FFU 150 to pass through. The FFU 150 is secured to, and forms a seal with, the upper support member 104. A wafer transfer plate 122 is secured to, and forms seal with, the bottom pan 118 and the FFU 150. The wafer transfer plate 122 may include transfer windows 121 that allow the wafer engine 300 to transfer wafers between the Class-1 Area and the process tool.

The system forms an air tight seal to maintain the Class-1 environment. An air tight seal is created between both the spine 100 and the bottom pan 118, the spine 100 and the FFU 150, and the wafer transfer plate 122 with both the FFU 150 and the bottom pan 118. Generally, the pressure within the Class-1 Area is maintained at a level higher than that of the atmosphere surrounding the Class-1 Area. This pressure differential prevents unfiltered air from entering the Class-1 Area. Accordingly, airborne particles or contaminates are blown out of the Class-1 Area through the openings in the bottom pan 118. On occasion tools operate in a hostile environment, such as for example, a pure nitrogen environment. In such an environment it is necessary to completely isolate the Class-1 Area from the outside surrounding environment. A plenum may be secured to, and sealed with, the bottom pan 118, so that the mini-environment within the structure 100 is completely isolated from atmospheric conditions. A plenum 224 (see FIG. 14) may be mounted to the bottom pan 118 to capture the air and recirculate it back towards the fan/filter unit 150 mounted to the spine 100.

Wafer Engine

In general, the wafer engine 300 illustrated in FIGS. 18–23 minimizes mechanical inertias with respect to frequency of use and criticality of wafer transfer cycle time. By way of example only, some of the benefits resulting from this wafer engine 300 include (1) achieving faster wafer swap times, (2) a lower total system weight, and (3) a more compact, unified package. The wafer engine 300 may operate within any of the embodiments of the unified spine 100 disclosed in this application, or operate as a stand-alone device.

A preferred embodiment of the wafer engine 300 is illustrated in FIGS. 18–19. The wafer engine 300 includes four main coordinated drives to optimize the transfer of wafers within the EFEM. The four drives move a wafer along an x-axis, a theta axis, a z-axis, and radial or r axis.

The wafer engine 300 has a linear drive assembly 302 that moves the wafer engine 300 along an x-axis. Movement along the x-axis allows the wafer engine 300 to access each FOUP I/O port. The linear drive assembly 302 includes an x-carriage 304 and a rail system 306. The x-carriage 304 slidably engages the upper x-rail 310 and lower x-rail 312. The rail system 306 is mounted to the rear mounting plate 116, and includes an upper x-rail 310 and lower x-rail 312. The upper x-rail 310 and lower x-rail 312 extend along the x-axis and are substantially parallel to each other. The break lines running through the rail assembly 306 in FIG. 18 shows that the rail assembly 306 may be of any length. The rail assembly 306 is scalable so that the wafer engine 300 may travel along the rail assembly 306 to access, for example, the wafers stored in each FOUP 10. The rotational drive 350 of the wafer engine 300 is also mounted to the x-carriage 304. Thus, movement by the x-carriage 304 drives the wafer engine 300 along the x axis.

The wafer engine 300 may also rotate, pivoting about a theta (θ) axis. In a preferred embodiment, and as shown in FIG. 18, the rotational drive 350 includes a support column 364 that extends along the theta axis and mounts to a z-axis support 370. The rotational drive 350 includes a theta motor 363 to drive and rotate the support column 364. The rotational drive 350 may rotate in either a clockwise or counterclockwise direction. The rotational drive 350 may also mount directly to the vertical drive 380. Preferably, the theta axis does not travel through the center of the slide body 400. The advantages of this off-center configuration of the slide body 400 will be discussed later.

The rotational drive 350 further includes a fan extension platform 352. In a preferred embodiment of the wafer engine 300, and as shown in FIG. 20, a z slot fan 354 is mounted to the underside of the fan platform 352. This configuration of the wafer engine 300 locates the z slot fan 354 near the theta motor 362 and provides and air vent to exhaust the air driven through the z column 380 of the wafer engine 300. The air flushed through the z column 380 is projected downward, away from any wafer that is being transported by the wafer engine 300 (see FIG. 21). Alternatively, the airflow may be exhausted through, and out the bottom of, the rotational drive 350.

The vertical drive column 380 is mounted to the support member 370 and extends upward along the z-axis. The drive column 380 moves the slide body 400 (described hereinafter) of the wafer engine 300, and thus the wafer, up and down along the z-axis. In one embodiment, and as shown in FIG. 19, the drive column 380 is an elongated column that extends substantially perpendicular from the support member 370. A drive assembly is located within the drive column 380 and includes a z-drive motor 382, a z cable way 384, a z guide rail 386, and a z ball screw 388. Such drive means are well known in the art and do not require further disclosure. It is within the scope and spirit of the invention to move the slide body mechanism 400 by other means.

The slide body 400 preferably includes an upper end effector 402 and a lower end effector 404 for quickly swapping individual wafers along the r-axis. The slide body 400 supports the upper and lower end effectors 402 and 404 such that they are parallel to the wafers stored in each FOUP 10. As shown in FIG. 19, the upper end effector 402 and lower end effector 404 travel along a similar rectilinear path. The upper end effector 402 and lower end effector 404 are separated by a distance sufficient to allow the lower end effector 404 and the upper end effector 402 to simultaneously store wafers. The slide body 400 includes radial drive motors 410 for moving the upper end effector 402 and lower end effector 404 linearly along the radial or r-axis.

The upper end effector 402 is supported by an first support 406 and the lower end effector 404 is supported by a second support 408. The upper end effector support 406 and lower end effector support 408 each slidably engage and travel within a radical guide rail 410 that extends substantially across the length of the slide body 400. Each radial drive motor 410 drives a radial drive belt 414. The radial drive belt 414a is connected to the first support 406, and the second radial drive belt 414b is connected to the second support 408. The radial drive motor 410 may rotate in a clockwise or counter-clockwise direction to rotate the radial drive belt around a radial drive pulley 416 and an end idler pulley 418 and to extend and retract the respective end effector. Such a drive mechanism is well known in the art and does not require further disclosure. It is within the scope and spirit of the present invention to have other means to move a wafer along the radial or r-axis.

The wafer engine 300 has many moving parts. Moving parts tend to create particles. For example, the continual extension and retraction of the upper end effector 402 and lower end effector 404 will create particulates within the mini-environment. To prevent the particulates from contaminating the wafer located on either end effector, a slide body fan/filter unit (FFU) 420 is mounted to the underside of the slide body 400. The slide body FFU 420 continuously pulls air in through the slide body slide slots 420, pulls the air through the slide body 400, filters the air, and then exhausts the air out into the Class-1 Area. This localized filtering of the air flow greatly reduces the amount of particles placed into the Class-1 Area.

Conventionally, most mini-environments include a single fan/filter unit that circulates the air through the mini-environment and only filters the air flow as it flows into the EFEM. Any particulates created within the mini-environment downstream of the fan/filter unit remain in the clean area until they are exhausted out of the EFEM. It is desirable to minimize the number of particulates within the mini-environment especially since the trend in semiconductor manufacturing more and more requires a lower tolerance of particle contamination on the wafers.

The localized filtering of the wafer engine 300 removes particles created by any rotating or sliding mechanism located on the wafer engine 300 as the particle is created. In a preferred embodiment, and as shown in FIGS. 19 and 21, a local fan/filter unit or fan system is located approximate to both linear drives of the z column 380 and slide body mechanism 400. As specifically shown in FIG. 21, the fan/filter unit mounted to the slide body mechanism 400 exhausts filtered air into the clean mini-environment, while the z slot fan system of the vertical drive 380 exhausts unfiltered air through the bottom plate of the EFEM. The wafer engine 300 filters and exhausts air into the Class-1 Area of the EFEM. If the wafer engine 300 did not have the fan/filter mounted to the slide body mechanism 400, particles created by the slide body mechanism 400 would travel through the Class-1 Area and contaminate the wafer supported by either end effector.

FIG. 20 illustrates another embodiment of the wafer engine 300. In this embodiment, the slide body 400 engages the z column 380 such that the z column 380 is substantially along the r axis. Similar to previous embodiments of the wafer engine 300, this embodiment includes a theta motor 362, a vertical drive column 380 and a radial slide body 400. The theta motor rotates the wafer engine about the theta axis, the z column moves the radial slide body 400 linearly along the z axis, and the radial slide body 400 moves the end effector 401 along the radial or r-axis. Accordingly, the wafer engine and thus the wafer will rotate about the theta axis any time the theta motor 362 rotates. This embodiment may also include a fan/filter unit mounted to the radial slide body 400 in a v slot fan similar to the previous embodiment of the wafer engine 300.

As previously mentioned, the slide body 400 of the wafer engine 300 may include different configurations of end effectors. As illustrated in FIGS. 18–19, the upper and lower end effector 402 and 404 may include a passive edge support. Such a configuration is known in the industry as passive edge grip end effectors for 300 mm wafers. FIG. 22 illustrates that the upper end effector 402 may include an active edge grip, while the lower end effector 404 may include a passive edge support. Alternatively, the end effectors 402 and 404 may include any combination of, for example, a vacuum grip with backside contact, a reduced contact area, removable pads.

Similarly, the radial drive 400 may include different types of end effector for handling wafers at different stages. For example, one end effector may handle only "dirty" wafers, while the second end effector may handle only "clean" wafers. Alternatively, one end effector may be designated to align and read the wafer ID before transferred to the process tool, while the second end effector may include high temperature pads for handling hot wafers after being processed.

FIG. 32 illustrates another linear travel robotic system that may operate within the EFEM. The robot 500 includes a x axis linear bearing 506, a rotational drive 508 slidably engaged with the x axis linear drive 506, a z column 520, a z drive mechanism 512, a first rotary arm 514, and a second rotary arm 516. The robot 500 uses coordinated motion of the drives for wafer extraction and placement. The rotational drive 508 moves along the x axis within a guide rail 507. The z column 510 extends substantially perpendicular from the rotational drive 508. The z drive mechanism 512 moves along the z axis within the guide rail 511 of the z column 510. Mounted to the top of the z drive mechanism 512 is the first rotary arm 514. The first rotary arm 514 rotates about a θ2 axis. The second rotary arm 516 is rotatably mounted to the first rotary arm 514. The coordinated motion between the first and second rotary arm 416 and 516 linearly moved the end effector 518 along the y axis. As in previous embodiments of the wafer engine 300, the z column 510 is mounted to the side of the end effector 518.

Integrated Tools in Wafer Engine

A conventional wafer handling robot transports individual wafers, for example, from a FOUP 10 to a separate processing station. The processing station inspects or aligns the wafer and then the wafer handling robot may transport the wafer to the next station. Often the wafer handling robot must sit idle or return to a FOUP 10 to transport a second wafer while the process station operates. Such an operation reduces the throughput of the system.

In one embodiment, the wafer engine 300 includes a slide body 400 that may perform one or several of these functions normally performed at a separate processing station. Integrating one or several of these functions into the slide body 400 will increase the throughput of the system and reduce the footprint of the EFEM.

FIGS. 22–23 illustrate a wafer engine 300 equipped with a wheeled aligner 440 and ID reader 430 mounted on the slide body 400. This embodiment is similar to the wafer engine 300 as shown in FIGS. 18–19, with the addition of a wheeled aligner 440 mounted on the upper end effector 402, and an ID reader 430 mounted to the slide body 400. It is within the spirit and scope of the invention for the lower end effector 404 to include a wheeled aligner.

The ID reader 430 may view up or down for reading marks on top and/or bottom surfaces of the top or bottom of the wafer. It is within the scope and spirit of the invention for the ID reader 430 to be mounted to the vertical drive 380, or be mounted in a fixed location elsewhere on the wafer engine 300. In the preferred embodiment, it is advantageous to mount a top side ID reader 430 on the slide body 400 for fast ID reading. A second ID reader may be mounted at a fixed location elsewhere in the EFEM for reading the bottom side T7 mark for confirmation or clarification of wafer ID is required.

If ID reading is required but wafer orientation is not important, the aligner may be eliminated and the ID reader 430 may view the ID mark in whatever location the wafer arrives on the end effector. To facilitate this operation, the ID reader 430, or a mirror assembly, may be rotated above the surface of the awfer to view the ID mark. This eliminates the need to rotate the wafer for ID reading and thus improves cleanliness and throughput.

An aligner controls the rotation of the wafer about an axis, such as by wheel or other means. FIGS. 23–24 illustrate one embodiment of an end effector with a wheeled aligner 440. The wheeled aligner 440 includes a drive system 449 and a paddle plate 442. The paddle plate 442 is the main support for the wafer. Located at the end of the paddle plate 442 are two sets of passive tip wheels 446 and two pads 448. The wheels 446 and pads 448 support the wafer at different times during alignment. A drive wheel 450, located at the back end of the paddle plate 442, supports the wafer along a third contact surface while the wafer is being aligned.

In one embodiment, wheeled end effector 440 slides underneath a wafer located in a FOUP 10 and is raised until the wafer is supported by the pads 448. The pads 448 preferably only support the wafer along its bottom edge. To align the wafer, the wafer is pushed forward by the drive wheel 450 and up onto the wheels 446. The wafer is lifted off the pads 448 and is fully supported by the drive wheel 450 and the tip wheels 446. At this point the drive wheel 450 may rotate to spin the wafer in situ. This operation may be performed while the wafer engine 300 is transporting the wafer. The wafer engine 300 does not have to remain in place to align the wafer.

Alternatively, as shown in FIG. 26B, the slide body 400 may include a vacuum chuck aligner 411. The drive mechanism for the vacuum chuck aligner 411, including a lift and rotation axis, may reside inside the slide body 400. A sensor 409 may be mounted to the end effector 403 to locates the edge of the wafer while it remains on the end effector. The sensor 409 may also be mounted to an structure that is independent of the end effector 403. In general, the sensor 409 may be located at various locations as long as the sensor 409 can be positioned to read the top surface of the wafer.

The edge position may be mapped relative to the rotation angle to find the center and orientation of the wafer. The sensor 409 functions as a secondary feedback device. The location of the sensor 409 is known relative to the wafer at all times. Thus, the sensor 409 may send error signals indicating that the wafer is not aligned. Since the aligner receives additional error data from the sensor 409, an aligner with such a sensor will improve the accuracy of the aligner. The wafer can then be reoriented by the chuck 411 and placed on center at the next drop off station by the wafer engine 300.

The sensor 409 may be mounted independently within the EFEM and be a separate component from the wafer engine 300. In such a configuration, the wafer is placed on the chuck 411 that can rotate. The sensor 409, mounted on a mechanism that has position control and measuring means (not shown), is moved to the proximity of the wafer edge until the sensor signal is at a desired level. The wafer can then be rotated while the sensor mechanism uses the signal from the sensor 409 to keep the position of the sensor 409 at the this desired level, effectively keeping the sensor 409 at the same relative position to the wafer edge. As the wafer is rotated, the sensor position is recorded with respect to the angular position of the wafer. This data represents the change in radial position of the wafer edge with respect to wafer rotational position, and can be used to calculate the center of the wafer with respect to the center of the wafer chuck and the orientation of the fiducial. If the sensor signal magnitude is also recorded along with the sensor mechanism position, it can be provide additional edge position information that could improve the accuracy of the wafer center calculations or fiducial orientation.

The wheeled end effector aligner 440 may include other components such as, but not limited to, an optical notch sensor 452 to detect the notch along the edge of the wafer. For example, once the notch has been located along the edge of the wafer by the optical notch sensor 452 the drive wheel 450 may rotate the wafer to the desired position and retrack back, allowing the wafers to fall back down onto the pads 448. This operation may be performed while the end effector is in place or is moving. The ability to align the wafer while it is being transferred between FOUPs 10, or between a FOUP 10 and a processing tool, greatly reduces or eliminates the amount of time that an end effector must side idle. Further, there is no need for a separate processing station if the wafer engine 300 can align a wafer "on-the-fly."

The slide body 400 enables a stable mounting platform for a variety of auxiliary functions, measurements, and sensors to acquire various wafer data. By way of example only, components may be integrated into or mounted to the slide body 400 to detect a wafer edge, detect the notch location on the wafer, read the OCR/bar code, perform particulate counting (back side or front side), determine film thickness/uniformity or circuit element line width, and detect resistivity (via contact probes or non-contact means) and wafer thickness. Other processes known in the art for inspecting and marking a wafer may be incorporated into the slide body 400.

In order to transfer workpieces from a carrier, the end effectors 402 and 404 move horizontally under the workpiece to be transferred and then moved upward to lift the workpiece off its resting place. The end effectors 402 and 404 may also include edge grips for supporting the workpiece at its edges. Alternatively, the end effectors 402 and 404 may be a blade type end effector for supporting a workpiece by its own bottom surface. In such embodiments, a vacuum source (not shown) may be affixed to or remote from the paddle plate 442, which creates a negative pressure that is communicated through the workpiece handling robot via flexible vacuum tubes to the surface of the end effector blade. Upon activation of the vacuum source a negative pressure is formed at the surface of the end effector blade, creating a suction capable of holding a workpiece firmly thereon. A vacuum sensor (not shown) of known construction may also be provided on the robot and associated with the vacuum system for detecting when a workpiece is engaged with the end effector and restricting the pull of air through the vacuum tubes. It is understood that the present invention is not limited to the end effector described above and that a variety of end effector designs may be used as long as the end effector has the capability to pick up and drop off workpieces.

The slide body 400 may also be adapted to process a wafer and enviromentally isolate the wafer from the Class-1 Area. By way of example only, the slide body 400 may include process tools to either heat or cool the surface of the wafer, or conduct thermal surface processing. In another embodiment, the slide body 400 may include a housing (not shown) that a wafer may be retracted into and temporarily stored within while the wafer engine 300 is transferring the wafer out of the process tool and within the Class-1 Area. The housing provides an inert or clean environment that has a better than Class-1 Area environment. Such a system may include floating oxygen or an inert gas over the surface of the wafer while it is being transported.

Dual Swap Capability

The time between when a processed wafer is removed from the process station and when a new wafer is placed into the process station is known as the "swap time." For most process tools, the throughput is determined by the process time plus the swap time. Reducing either increases throughput. The process time is the purview of the tool manufacturer, the swap time is the purview of the capital EFEM manufacturer.

For a conventional single end effector wafer handling robot in an EFEM (see FIG. 17), the swap time may be 8 to 16 seconds, depending on the station arrangement and the speed of the wafer handling robot. The following sequence of operations are commonly used by such a robot to swap a wafer at a process station. The items contributing to the swap time are in italics. Items outside of the critical path determining throughput are in (parenthesis).

1. Get wafer from process station
2. Put processed wafer to load port
3. Get aligned wafer from aligner
4. Put aligner wafer to process station
   [Begin processing wafer]
5. (While processing, robot get new wafer from load port)
6. (While processing, robot put new wafer to aligner)
7. (While processing, aligner align wafer)
   [Repeat]

A rapid swap robot (e.g. wafer engine 300) has two end effectors and therefore can dramatically reduce swap time by performing the same function as above using the following abbreviated sequence:

[Process Complete]
1. Get wafer from process station with paddle 1
2. Put aligned wafer to process station with paddle 2
   [Process wafer]
3. (While processing, get new wafer from load port)
4. (While processing, put new wafer to aligner)
5. (While processing, aligner align wafer)
6. (While processing, get aligned wafer from aligner)
   [Repeat]

In this case, the swap time may be reduced by 3 to 6 second depending on the speed of the robot. The overall time for the robot to complete all of its motions may be slightly reduced as well. The overall motion time is of primary importance in applications where the process time is very low and therefore the items in parenthesis above would enter into the critical path or throughput.

A further improvement on throughput and reduction in total robot motions can be made if the robot has align-on-the-fly capability as well as rapid swap capability like the wafer engine 300 having a wheeled end effector aligner 440. Align-on-the-fly does not reduce swap time, but it does reduce overall robot motion time and therefore increases throughput where the process time is low, or where the robot must support multiple process stations. Also, by reducing the number of robot motions and wafer handoffs, align-on-the-fly can increase robot life and improve cleanliness.

For the align-on-the-fly rapid swap wafer engine, the comparable sequence of operations is:

[Process Complete]
1. Get wafer from process station with paddle 1
2. Put aligned wafer to process station with paddle 2
   [Process Wafer]
3. (While processing, get new wafer from load port)

4. (While processing, align wafer and simultaneously move to position for next rapid swap)
   [Repeat]

Unlimited Z-axis Motion

FIG. 25 illustrates a wafer engine 300' including an off-center slide body 400 having a wheeled aligner 454 and ID reader 430, and an extended z-axis drive column 380'. This embodiment of the wafer engine includes an extended z column 380' to, for example, to access a stocker, or a load port or process station that may be located above the FOUP I/O port. Basically, the height of the z-axis drive column 380 or 380' is unlimited. The wafer engine 300 or 300' may access a wafer located within a FOUP 10 by moving the upper end effector 402 or the lower end effector 404 along the radial or r-axis. The distance that the upper end effector 402 or lower end effector 404 must travel into the FOUP 10 is designed to be a short distance since this is the most often required motion of the wafer engine 300 or 300'. The height of the vertical drive column 380 or 380' does not effect the distance that either the upper end effector 402 or lower end effector 404 must travel. Thus, the height of the vertical drive column 380 or 380' does not effect the motion along the radial or r-axis.

Conventional wafer handling robots must move the z drive column linearly towards the FOUP 10 so that the end effector may access and remove the wafer from the FOUP 10. Accordingly, a tall vertical drive column for such a wafer handling robot requires moving a large vertical column by a motor or a belt drive. Moving such inertia places great strain on the wafer handling robot. The wafer engines disclosed in this application are an improvement over such wafer handling robots because the axis of motion, along the radial or r-axis, which is the most commonly traveled are also the shortest distances.

FIG. 27A illustrates that a convention linear slide robot may reach into the processing tool 250 mm for transferring and retrieving wafers into the process tool. Similarly, a convention wafer handling robot requires a minimum clearance within the EFEM work space of 520 mm so that the wafer handling robot can maneuver within the EFEM. FIG. 27B illustrates the reach and swing clearance advantage of the off-center slide body rotation about the theta axis. In a preferred embodiment, the off-center slide body axis of rotation, shown as the theta axis in FIG. 19, is offset by approximately 50 mm. The off-center axis of rotation for the wafer engine 300 has two distinct advantages. First, the maximum reach of an end effector (e.g., upper end effector 402 or lower end effector 404) into the processing tool is increased to 350 mm. Second, the minimum clearance required within the EFEM work space is reduced to 420 mm. The maximum reach and minimum clearance distances are by way of example only. Increasing the reach of the end effector into the process tool, while decreasing the minimum clearance required for the wafer engine 300 to maneuver within the EFEM reduces the overall footprint of the EFEM.

FIG. 28 illustrates an example motion sequence of the wafer engine 300 have a rapid swap slide body 400 with off-center rotation axis. By way of example only, step one illustrates the wafer engine 300 lifting the wafer at load port area one. Step two illustrates the wafer engine 300 retracting the wafer from within load port one along a radial axis. Step three illustrates the wafer engine 300 rotating about the theta axis and simultaneously moving back along the x-axis to avoid collision with load port one. Step four illustrates the wafer engine 300 moving along the x-axis towards the I/O port of the processing station. Step five illustrates the wafer engine 300 continuing to rotate about the theta axis and along the x-axis to position the wafer for entry into the processing station. Step six illustrates the wafer engine 300 waiting for the process to complete. Step seven illustrates the wafer engine 300 swapping the processed wafer for the new wafer ready to enter the processing station. Finally, step eight illustrates the wafer engine 300 retracting the processed wafer in a radial axis while simultaneously moving along the x and theta axis to return the processed wafer into load port one, two or three.

The wafer engine 300 and 300' described above provides several benefits over conventional wafer handling robots. For most wafer handling applications, radial motion needed to insert and remove wafers into and out of a FOUP 10 or a process station has the highest duty cycle and longest overall distance traveled. The wafer engine 300 places the radial drive 400 as close to the wafer as possible before attempting to access the wafer. This placement reduces the moving mass and motion time of the upper end effector 402 and lower end effector 404, and wear.

The z-drive column 380 occupies the same volume of space that is swept out by the wafer as the wafer engine 300 rotates. The drive column 380 also does not extend below the work plane. A conventional wafer handling robot must utilize the area located below the wafer plane to access some of the wafers within the FOUP 10. Typically, the end effector is mounted to the top of a column that travels up and down along the z axis. The column takes up space that could otherwise be used for other purposes. Similarly, when the column moves horizontally along the x axis, the area located below the wafer plane must substantially empty so that the column does not run into and damage any obstacles.

there are several variations and/or modifications that can be made to the wafer engine 300 that still have the unique elements and benefits previously listed above. By way of example only, the x-axis drive 302 may be eliminated for some applications. Similarly, a single radial axis may suffice. Further, for some applications (e.g., sorters) may not require a rotational drive. Instead, the z-axis drive 380 would mount to the x-carriage 308. A sorter application, for example, may have all of the load ports mounted facing the same direction, and if the alignment and ID reading is integral into the wafer engine 300, the ned to rotate would be eliminated.

FIGS. 29–31 illustrate several configurations of the integrated system. FIG. 29A illustrates the integrated system mounted on a roll out frame. As previously mentioned, conventional EFEMs extend all the way down to the floor of the wafer fab. With the space savings derived from constructing an EFEM from spine structure 100 or other embodiments disclosed in this application, the footprint of the integrated system is greatly reduced. As shown in FIG. 29A, the integrated system is mounted on a roll out frame so that the load port assemblies remain at the SEMI standard height of 900 mm. When this integrated system is bolted to the front end of a processing tool, and in a preferred embodiment, there will be approximately 2 feet of open space located beneath the integrated system and the wafer fab floor. This space has never been available in a wafer fab before. Such a space will allow semiconductor manufactures to place other items such as an electrical control box underneath the integrated system.

Alternatively, a processing tool may now have a maintenance access that can be reached by crawling underneath the integrated system. The roll out frame also improves the overall maintenance features of the processing tool that the integrated system is bolted to. By way of example only, if maintenance needs to be performed on the processing tool, the integrated system may be unbolted from the processing tool, the wheels of the roll out frame may be unlocked, and the integrated system may be rolled away from the front end of the processing tool. A conventional EFEM that is bolted to the processing tool does not contain wheels that the EFEM can be rolled out on, and is typically such a heavy device that it requires more than one maintenance person to lift the EFEM away from the process tool. As previously mentioned, the integrated system of the present invention weighs only several hundred pounds and thus can be easily rolled away from the front of the processing tool by a single maintenance person.

FIGS. 30 illustrates the integrated system integrated into a process tool. By way of example only, the system of the present invention may be integrally formed and mounted to a process tool. One advantage of this system is that if every process tool within the wafer fab had an integrated system mounted to it, the wafer fab would have a front and load system that can be configured to the needs of each process tool yet contain a similar environment to reduce the need for stocking spare parts and training maintenance personnel.

Electrical Control System

Conventional EFEMs must contain a power distribution that is compatible with the power requirements for countries across the world. Therefore, most EFEMs today must be able to adapt to either a 110V or 220V system. Being able to a adapt to either power system requires than an EFEM include power components such as step down or step up transformers as well as other electrical components. Such electrical components must be mounted within the EFEM and thus increase the footprint of the EFEM.

The EFEM of the present invention is designed for all electrical components such as the FOUP advance plate assembly, the wafer engine 300 and the fan/filter unit 150 to operate all under a 48V system. In general, the EFEM of the present invention may be electrically connected to either a 100V or 220V system that will stepped-down to 48V to control all of the elements described previously. Simplifying the electrical distribution system of the EFEM eliminates the need for many of the conventional power distribution components such as the step up transformer and thus further decreases the footprint of the EFEM of the present invention.

We claim:

1. A wafer engine for moving semiconductor workpieces, comprising:
   a linear drive assembly having a carriage, said linear drive assembly for moving said carriage between a first position and a second position along a first linear path, said first linear path defining an x-axis;
   a support column having a first end a second end, and a longitudinal central axis;
   a rotational drive housing mounted to said carriage, said rotational drive housing substantially enclosing a rotational drive being adapted to affix to said first end of said support column for rotating said support column about said longitudinal central axis, said longitudinal central axis defining a substantially vertical theta axis that is substantially perpendicular to said x-axis;
   a vertical drive column extending upward from a support member having a first end and a second end, said first end of said support member mounted to said second end of said support column such that said rotational drive rotates said support member and said vertical drive column about said theta axis;
   a z-axis drive assembly having a mechanism being adapted to move vertically within said vertical drive column between a first position and a second position along a second linear path;
   a slide body mounted to said mechanism, said slide body substantially enclosing a radial drive assembly being adapted to move an end effector between a first position and second position along a third linear path, said third linear path defining a radial axis; and
   wherein said theta axis is offset from a z-axis traveling substantially through the geometric center of said slide body.

2. The wafer engine as recited in claim 1, wherein said rotational drive simultaneously rotates said vertical drive column, said support member and said slide body about said theta axis.

3. The wafer engine as recited in claim 1, further including an exhaust device affixed to said rotational drive housing.

4. The wafer engine as recited in claim 3, wherein said exhaust device draws air located within said vertical drive column and said support member into said support column and vents the air located within said support column out through of said exhaust device.

5. The wafer engine as recited in claim 1, wherein said slide body is removably mounted to said mechanism.

6. The wafer engine as recited in claim 5, wherein said slide body includes at least one component selected from the group consisting of (i) an ID reader, (ii) a metrology tool, (iii) an aligner, (iv) a notch detector, (v) an edge detector, (vi) a wafer marking tool, (vii) a processing module, (viii) a wafer viewing, and (ix) an environmental control device.

7. The wafer engine as recited in claim 1, further including a fan/filter unit mounted to said slide body, said fan/filter unit for drawing air within said slide body into said fan/filter unit and filtering the air before venting the air out of said fan/filter unit.

8. The wafer engine recited in claim 1, further including a fan unit mounted to said rotational drive housing for drawing air in said vertical drive housing through said support column and out of said fan unit.

9. The wafer engine as recited in claim 8, wherein the air blown out of said fan unit comprises unfiltered air.

10. A wafer engine for transporting semiconductor wafers, comprising:
    a first drive assembly having a mounting element, said first drive assembly being adapted to move said mounting element between a first position and a second position along a first linear path, said first linear path defining an x-axis;
    a support column having a first end and a second end;
    a rotational drive housing mounted to said mounting element, said housing substantially enclosing a rotational drive that is and affixed to said first end of said support column, said rotational drive being adapted to rotate said support column about a longitudinal central axis of said support column, said longitudinal central axis defining a theta-axis;
    a substantially L-shaped z-axis drive housing having a vertical drive column extending from a support member that is affixed to said second end of said support column, said vertical drive column substantially enclosing a z-axis drive assembly having a mechanism being adapted to move vertically between a first position and a second position along a second linear path;
    a slide body removably mounted to said mechanism, said slide body substantially enclosing a radial drive assembly having a second mechanism being adapted to move between a first position and a second position along a third linear path, said third linear path defining a radial axis;

an end effector mounted to said second mechanism; and wherein said theta axis is offset from a z-axis traveling substantially through the geometric center of said slide body.

11. The wafer engine as recited in claim 10, wherein said slide body includes at least one component selected from the group consisting of (i) an ID reader, (ii) a metrology tool, (iii) an aligner, (iv) a notch detector, (v) an edge detector, and (vi) a wafer marking tool.

12. The wafer engine recited in claim 10, further including an exhaust device affixed to said rotational drive housing, said exhaust device for drawing air located within said substantially L-shaped z-axis drive housing through said support column in order to vent the air out of said exhaust device.

13. The wafer engine recited in claim 12, further including a fan/filter device mounted to said slide body, said fan/filter device for drawing within said slide body into said fan/filter unit and filtering the air before the air is vented out of said fan/filter unit.

* * * * *